United States Patent [19]
Salerno et al.

[11] Patent Number: 5,743,614
[45] Date of Patent: *Apr. 28, 1998

[54] HOUSING ASSEMBLY FOR A MATRIX DISPLAY

[75] Inventors: Jack Salerno, Waban; Matthew Zayracky, Plympton; Stephen Offsey, Brookline; David Chastain, Acton; Michel Arney, Needham; Benjamin Beck, Boston; Gregory Hunter, Westwood; Kevin O'Connor, South Easton; Alan Richard, Wrentham, all of Mass.

[73] Assignee: Kopin Corporation, Taunton, Mass.

[*] Notice: The term of this patent shall not extend beyond the expiration date of Pat. No. 5,396,304.

[21] Appl. No.: 480,966

[22] Filed: Jun. 7, 1995

Related U.S. Application Data

[63] Continuation-in-part of Ser. No. 332,883, Nov. 1, 1994, which is a continuation of Ser. No. 106,071, Aug. 13, 1993, Pat. No. 5,376,979, which is a continuation-in-part of Ser. No. 16,138, Feb. 10, 1993, Pat. No. 5,396,304, which is a continuation-in-part of Ser. No. 944,207, Sep. 11, 1992, Pat. No. 5,444,557, which is a continuation-in-part of Ser. No. 823,858, Jan. 22, 1992, abandoned, and Ser. No. 872,297, Apr. 22, 1992, Pat. No. 5,317,436, which is a continuation-in-part of Ser. No. 839,241, Feb. 20, 1992, abandoned, which is a continuation-in-part of Ser. No. 636,602, Dec. 31, 1990, Pat. No. 5,206,749.

[51] Int. Cl.⁶ ............................................. G03B 21/00
[52] U.S. Cl. .................................... 353/122; 353/103
[58] Field of Search .................................. 353/119, 120, 353/122, DIG. 3, DIG. 5; 359/83

[56] References Cited

U.S. PATENT DOCUMENTS

| | | | |
|---|---|---|---|
| 4,105,313 | 8/1978 | Altman | 353/65 |
| 4,393,380 | 7/1983 | Hosokawa et al. | 340/805 |
| 4,429,305 | 1/1984 | Hosokawa et al. | 340/784 |
| 4,582,395 | 4/1986 | Morozumi | 350/334 |
| 4,600,274 | 7/1986 | Morozumi | 350/339 |

(List continued on next page.)

FOREIGN PATENT DOCUMENTS

| | | |
|---|---|---|
| 0151508 | 8/1985 | European Pat. Off. |
| 2596-880-A | 4/1986 | France. |
| 63055529 | 10/1988 | Japan. |
| 1038727 | 9/1989 | Japan. |

*Primary Examiner*—William Dowling
*Attorney, Agent, or Firm*—Hamilton, Brook, Smith & Reynolds, P.C.

[57] ABSTRACT

A housing is mountable on a carousel slide projector. The housing contains a movable light valve slide assembly that is coupled to a video signal source. The light valve slide assembly is movable between a position within the housing and a position outside the housing. When mounted on the slide projector, the light valve slide assembly can be moved into the projection chamber of the slide projector. The video signal source transmits a video signal to the light valve slide assembly, where the video signal is converted to a drive signal to actuate pixels on the light valve. The light valve thus generates a video image that is projected onto a viewing surface. Preferably the light valve is an active matrix liquid crystal display.

44 Claims, 25 Drawing Sheets

U.S. PATENT DOCUMENTS

| | | | |
|---|---|---|---|
| 4,653,862 | 3/1987 | Morozumi | 350/339 |
| 4,655,551 | 4/1987 | Washizuka et al. | 350/334 |
| 4,716,403 | 12/1987 | Morozumi | 340/702 |
| 4,740,782 | 4/1988 | Aoki et al. | 340/719 |
| 4,807,974 | 2/1989 | Hirai | 350/332 |
| 4,808,983 | 2/1989 | Benjamin et al. | 340/719 |
| 4,838,654 | 6/1989 | Hamaguchi et al. | 350/333 |
| 4,859,997 | 8/1989 | Bouron et al. | 340/752 |
| 4,886,343 | 12/1989 | Johnson | 350/335 |
| 4,917,468 | 4/1990 | Matshushi et al. | 350/332 |
| 4,952,031 | 8/1990 | Tsundoda et al. | 350/342 |
| 4,963,001 | 10/1990 | Miyajima | 350/331 |
| 4,976,429 | 12/1990 | Nagel | 273/1 |
| 5,032,007 | 7/1991 | Silverstein et al. | 350/335 |
| 5,032,831 | 7/1991 | Kuijk | 340/784 |
| 5,090,800 | 2/1992 | Ushiro | 353/71 |
| 5,095,304 | 3/1992 | Young | 340/766 |
| 5,115,232 | 5/1992 | Iizuka | 340/784 |
| 5,117,298 | 5/1992 | Harai | 359/55 |
| 5,161,027 | 11/1992 | Liu | 358/231 |
| 5,187,510 | 2/1993 | Vogeley et al. | 353/122 |
| 5,376,979 | 12/1994 | Zavracky et al. | 353/122 |
| 5,396,304 | 3/1995 | Salerno et al. | 353/122 |

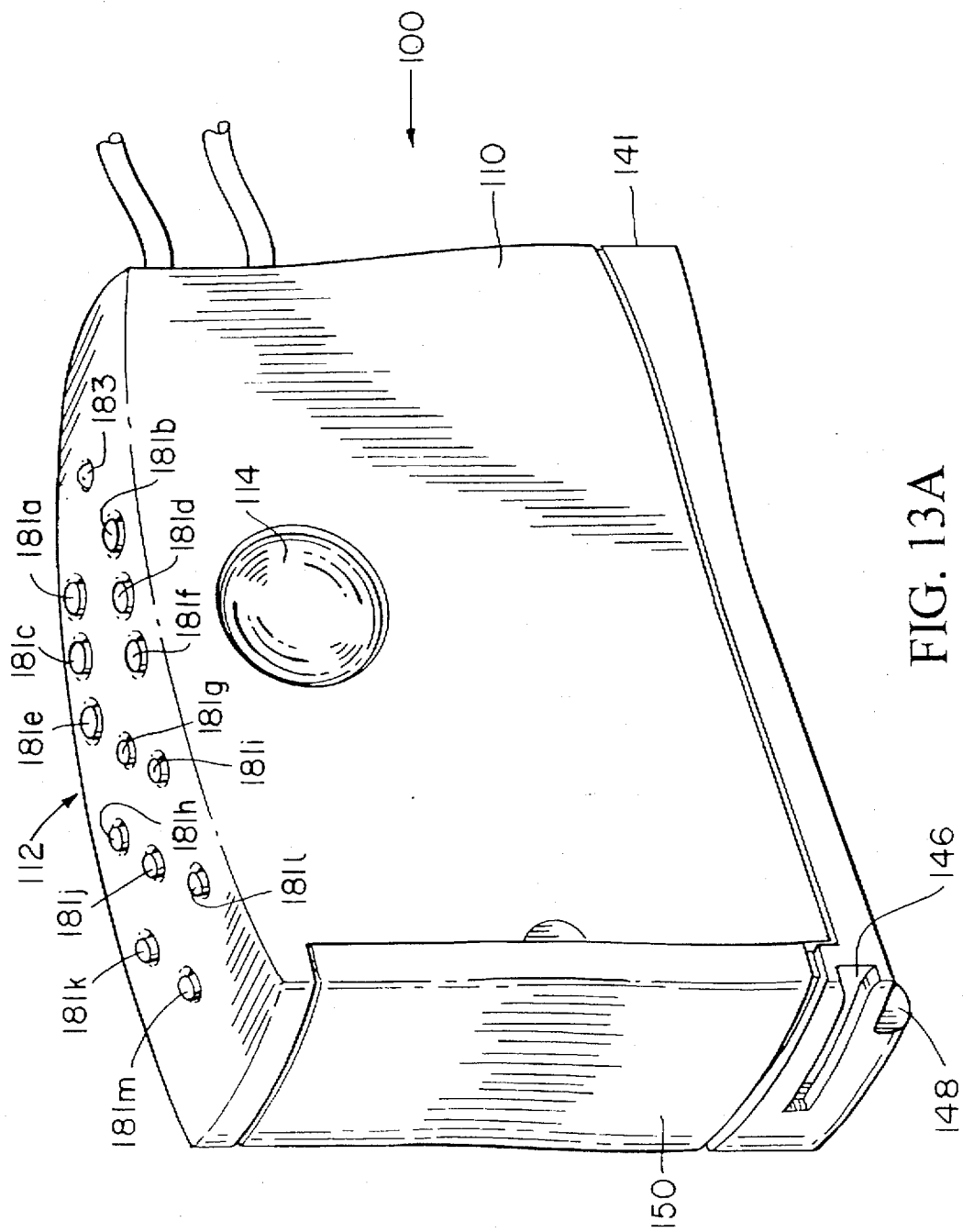

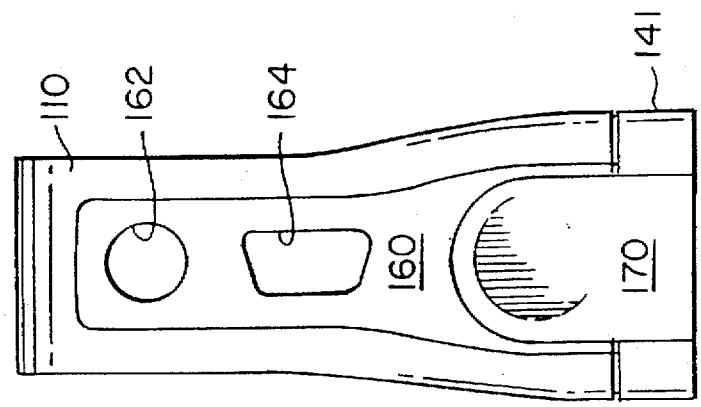
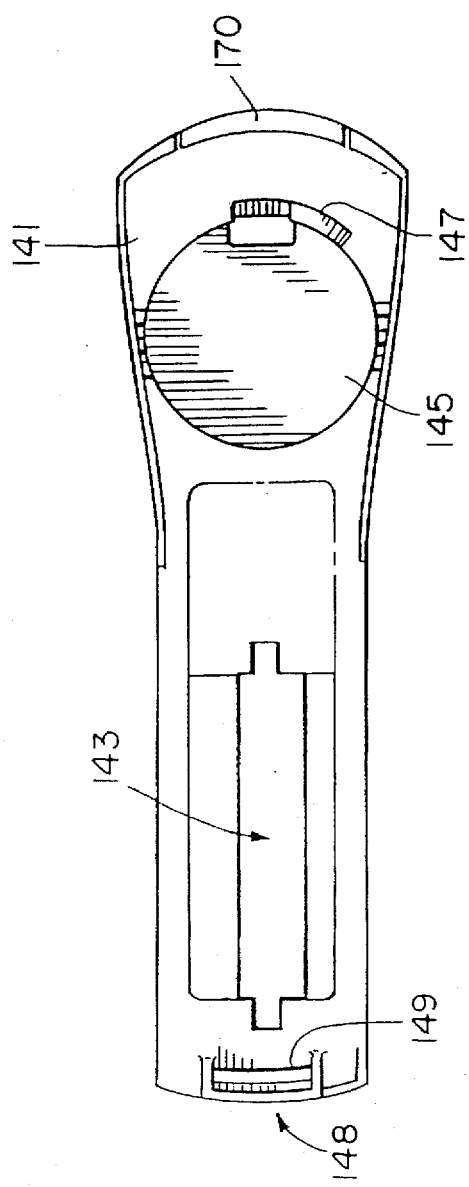
FIG. 13C
FIG. 13B

HOUSING ASSEMBLY FOR A MATRIX DISPLAY

RELATED APPLICATIONS

This is a Continuation-In-Part of U.S. patent application Ser. No. 08/332,883 filed on Nov. 1, 1994 and now abandoned, which is a Continuation of U.S. patent application Ser. No. 08/106,071 filed on Aug. 13, 1993 (now U.S. Pat. No. 5,376,979 issued Dec. 27, 1994), which is a Continuation-In-Part of U.S. patent application Ser. No. 08/016,138 filed on Feb. 10, 1993 (now U.S. Pat. No. 5,396,304 issued Mar. 7, 1995), which is a Continuation-In-Part of U.S. patent application Ser. No. 07/944,207 filed on Sep. 11, 1992, now U.S. Pat. No. 5,444,557, which is a Continuation-In-Part of U.S. patent application Ser. No. 07/823,858 filed on Jan. 22, 1992 and now abandoned, and Ser. No. 07/872,297 filed on Apr. 22, 1992 (now U.S. Pat. No. 5,317,436 issued May 31, 1994), which is a Continuation-In-Part of U.S. patent application Ser. No. 07/839,241 filed on Feb. 20, 1992 and now abandoned, which is a Continuation-In-Part of U.S. patent application Ser. No. 07/636,602 filed on Dec. 31, 1990 (now U.S. Pat. No. 5,206,749 issued Apr. 27, 1993) all of which are incorporated herein by reference in their entirety.

BACKGROUND OF THE INVENTION

Flat-panel displays are being developed which utilize liquid crystals or electroluminescent materials to produce high quality images. These displays are expected to supplant cathode ray tube (CRT) technology and provide a more highly defined television picture. The most promising route to large scale high quality liquid crystal displays (LCDs), for example, is the active-matrix approach in which thin-film transistors (TFTs) are co-located with LCD pixels. The primary advantage of the active matrix approach using TFTs is the elimination of cross-talk between pixels, and the excellent grey scale that can be attained with TFT-compatible LCDs.

Flat panel displays employing LCDs generally include five different layers: a white light source, a first polarizing filter that is mounted on one side of a circuit panel on which the TFTs are arrayed to form pixels, a filter plate containing at least three primary colors arranged into pixels, and finally a second polarizing filter. A volume between the circuit panel and the filter plate is filled with a liquid crystal material. This material will rotate the polarization of light when an electric field is applied across it between the circuit panel and a ground affixed to the filter plate. Thus, when a particular pixel of the display is turned on, the liquid crystal material rotates polarized light being transmitted through the material so that it will pass through the second polarizing filter.

Preferred embodiments of the present invention relates to projection display devices (i.e. monitors and image projectors) including methods of fabricating such devices using thin films of single crystal silicon in which a light valve matrix (or matrices) is formed for controlling images produced by these devices. In accordance with the present invention, projection display devices employing high density single crystal silicon light valve matrices provide high resolution images compatible with 35 mm optics.

In one preferred embodiment, an optically transmissive substrate is positioned to receive light from a back-light source and a light valve matrix is secured to the substrate. In accordance with the present invention, the light valve matrix includes an array of transistors and an array of electrodes which are formed in the thin film of single crystal silicon. The light valve matrix also includes an adjacent light transmitting material, through which light from the backlight source is selectively transmitted. Preferred embodiments are directed to light valves employing a transmissive light transmitting material such as liquid crystal or a ferroelectric material, although other transmissive materials may be used. Each light valve includes a transistor, an electrode and a portion of the adjacent light transmitting material. Each transistor, by application of an electric field or signal, serves to control the optical transmission of light through the adjacent light transmitting material for a single light valve.

A driver circuit is electrically connected to the light valve matrix to selectively actuate the light valves.

The drive circuitry may be formed in the same thin-film material in which the transistors and electrodes have been formed. The drive circuitry is capable of being fully interconnected to the matrix using thin-film metallization techniques without the need for wires and wirebonding. An optical system is also provided for projecting light transmitted through the actuated light valves onto a large viewing surface.

The present devices and related methods for fabricating projectors satisfy the requirements of large screen television or monitor displays for producing highly defined color images. To that end, a projection display device can have multiple light valves each adapted to selectively transmit light of a single primary color.

Further, a dichroic prism may be provided for combining the single color light transmitted by each light valve producing a multi-color light image which is projected onto a large viewing surface.

Other preferred embodiments of the present invention relate to an active matrix display panel adapted for use in a conventional 35 mm slide projector for providing monochrome or multi-color images. The display panel is fabricated to have equivalent physical dimensions as a standard 35 mm photographic slide having an image which can be projected by a slide projector. In accordance with the present invention, the active matrix display panel, being packaged to be size-equivalent with a standard 35 mm slide, is insertible into a slide projector with modification thereof for generating the projected images. An electronics unit is connected to the display panel and controls image generation by the active matrix. In preferred embodiments, the display panel is capable of generating monochrome or multi-color images.

In one preferred embodiment of the invention, an active matrix display device is adapted for use with a slide projector having a projector body, a light source, an optical system and a chamber in which a 35 mm slide can be placed for projection of its image onto an external viewing surface. The display device includes a housing and an active matrix display panel movably mounted to the housing. As such, the display panel has a storage position and an operating position. The housing is positioned on the slide projector body such that the display panel, being moved into the operating position, can be securely disposed in the projector chamber for selectively transmitting light from the light source to provide images for projection by the slide projector.

The housing preferably contains a shielded electronics assembly which is electrically connected to the display panel for controlling image generation. The electronics assembly receives image data from an image generation device which may be a computer or any video device. Image data provided by the device is processed by the electronics and sent to the active matrix display panel. Responsive to the received data, the individual active matrix light valves are activated such that the illuminating light from the light source is selectively transmitted through the active matrix to form monochrome or multi-color images.

In another preferred embodiment, the active matrix display device includes an active matrix display panel and a remote electronics housing. The display panel is dimensioned to be securely positioned in the chamber of the slide projector and is electrically connected to electronics in the remote housing by a cable.

In yet another preferred embodiment, the active matrix display device includes an active matrix display panel which is not physically connected to the electronics housing. Instead, the active matrix display panel and the electronics in the housing communicate with each other via antenna elements such as RF antennas or infrared transmitter/detector elements.

As with aforementioned embodiments, an active matrix display panel has an array of pixels or light valves which are individually actuated by a drive circuit. The drive circuit components can be positioned adjacent to the array and electrically connected to the light valves. As such, the individual light valves are actuated by the drive circuit so that illuminating light is selectively transmitted through the active matrix to form an image.

In preferred embodiments, the active matrix circuitry is formed in or on a layer of a semiconductor material such as silicon. It is noted that any number of fabrication techniques can be employed to provide preferred thin-films of polysilicon or single crystal silicon. In embodiments in which a thin-film of single crystal silicon is used, extremely high light valve densities can be achieved such that high resolution images are obtained. Other embodiments employ the use of a solid state material or any material whose optical transmission properties can be altered by the application of an electric field to supply the light valves of the present invention.

BRIEF DESCRIPTION OF THE DRAWINGS

The above, and other features of the invention including various novel details of construction and combination of parts, will now be more particularly described with reference to the accompanying drawings and that pointed out in the claims. It will be understood that the particular panel display and the methods used in fabricating those panels which embody the invention are shown by way of illustration only and not as a limitation of the invention. The principal features of this invention can be employed in various embodiments without departing from the scope of the invention.

FIGS. 13A–13D illustrate a preferred embodiment of the light valve housing with the light valve assembly retracted.

DETAILED DESCRIPTION OF PREFERRED EMBODIMENTS

Figure 1:
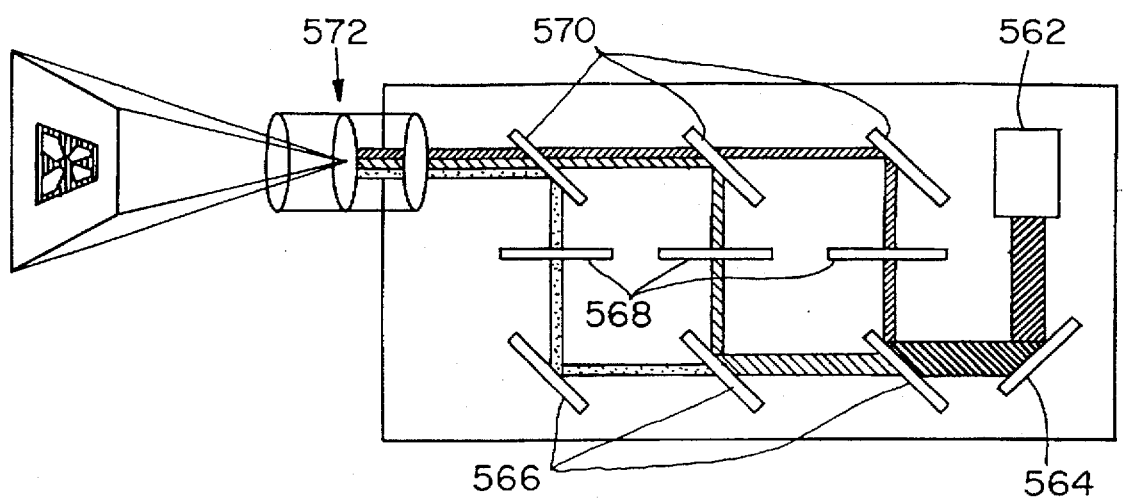
FIG. 1 is an illustration of an image projector of the present invention.

An image projector 560 employing the principles of the present invention is shown in FIG. 1. The projector employs a zoom or variable focus lens 572 for projecting images to a viewing surface (not shown). By replacing the zoom lens 572 with a simple lens, the projection system within the projector can be employed in a monitor system. White light from a lamp 562 is reflected off a mirror 564 and directed to three dichroic mirrors. The separated colors of light are directed by the mirrors to illuminate the back side of three liquid crystal light valve matrices 568. Each matrix, controlled by a driver circuit (not shown), selectively transmits light to form an image in the respective primary color at the front side of the matrix. The three primary color images are directed via dichroic mirrors 570 to lens 572. The lens combines the images into a single multi-color light beam.

The projector 560 employs a plurality of single crystal silicon light valve matrices and an optical geometry for producing high resolution color (or monochrome) images. The resulting images are directed through the zoom or variable focal length projection lens 572 to form an image beam capable of being front or back projected onto a viewing surface or screen. The projector provides high resolution images while being compatible with 35 mm optics.

Figure 2:
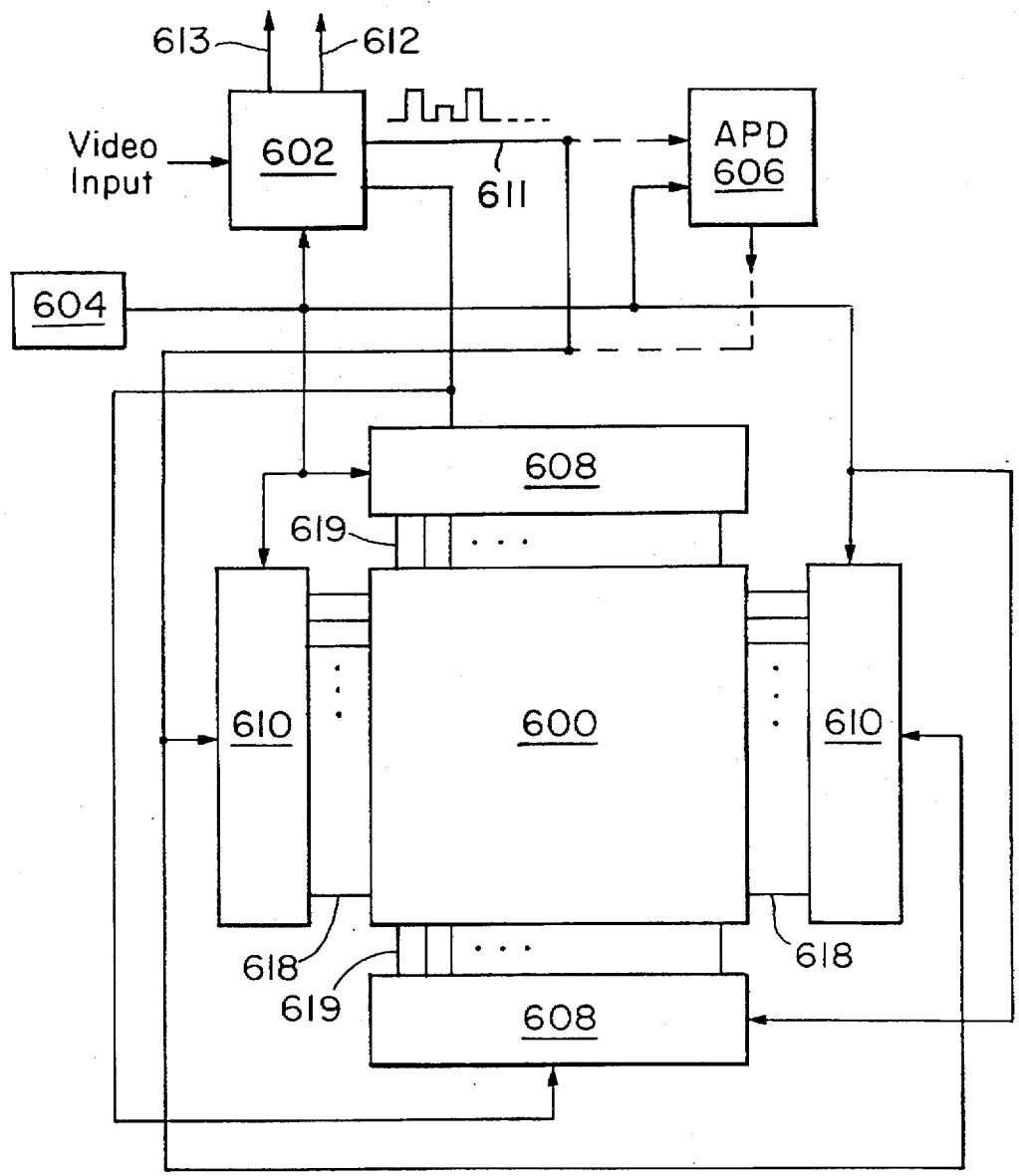
FIG. 2 is a circuit diagram illustrating the driver system for a projection device of the present invention

Preferred embodiments of the projection display devices include a driver circuit for driving one or more light valve matrices. Referring to FIG. 2, an active matrix 600 comprises a plurality of light valves which are individually actuated by collocated driver circuitry. The collocated driver circuitry is controlled by supporting driver circuitry which includes a video conditioning circuit 602, a system clock 604, an optional amplitude to pulse duration (APD) converter 606, column drivers 608, and a row drivers 610.

The video conditioning circuit 602 receives a video input signal which may be an RGB signal, an NTSC signal, an S-video signal or other video format signal, or any digital or analog video signal. The conditioning circuit processes the incoming signal producing separate video output signals (on lines, 611, 612 and 613) for each primary color and a synchronization signal (on line 615) for the column and row drivers 608 and 610. The video output signal on line 611 is a serial data stream wherein the amplitude of each signal of the data stream determines the intensity of light transmitted through each light valve.

If the APD convertor is not employed, the serial data stream on line 615 is received by the row drivers 610. The row drivers 610 send each of the signal data streams to the light valves through buses 618. The column drivers receive the sync signal on line 615 and, responsive to the sync signal, an activation signal is sent through buses 619 to turn on individual transistors allowing the associated signal of the data stream to charge the capacitor in each pixel. The capacitor sustains a charge, which is proportioned to the amplitude of the associated signal, on the light valve until the next scan of the array.

Alternately, the ADP converter may be employed such that each signal of the video output data stream is converted to a pulse having a pulse width which is proportional to the signal's amplitude. In any case, the driver circuit operates in the same manner as previously described.

Projection display devices of the present invention can employ light valve matrices having pixel densities which satisfy any of a wide range of the following existing computer display format requirements:

| Application | Display Format (Column × Row) |
|---|---|
| 1) Common Personal Computer | 1024 × 768 |
|  | 1280 × 1024 |
| 2) Workstation (Advanced Personal Computer) | 1280 × 1024 |
|  | 1580 × 1280 |
|  | 2048 × 2048 |
| 3) Other Workstations (Non-Standard) | 1152 × 900 |
|  | 1280 × 1024 |
|  | 1600 × 1280 |

Thus, a display monitor employing one or more single crystal silicon light valve matrices having any of the above-described pixel densities can be provided in accordance with the present invention.

One feature of the present invention is that projection devices employing single crystal light valve matrices provide high resolution images. High resolution images are possible because high density light valve arrays may be formed in single crystal silicon films. Referring to Table 1, the light valve diagonal is shown for various array sizes and pixel densities, where the diagonal dimensions followed by an asterisk indicate an array that is compatible with 35 mm optics.

TABLE 1

| DIAGONAL ARRAY DIMENSION - INCHES/(MM) | | | | |
|---|---|---|---|---|
| ARRAY | Fabricated dots/inch (DPI) on light valve matrix | | | |
| SIZE | 800 | 1000 | 1200 | 2000 |
| 1024 × 768 | 1.600* | 1.280* | 1.137* | 0.640* |
|  | (40.64) | (32.51) | (28.88) | (16.26) |
| 1280 × 1024 | 2.049 | 1.639* | 1.366* | 0.820* |
|  | (52.04) | (41.63) | (34.70) | (20.82) |
| 1580 × 1280 | 2.542 | 2.033 | 1.695 | 1.017* |
|  | (64.56) | (51.65) | (43.05) | (25.82) |
| 2048 × 2048 | 3.620 | 2.896 | 2.414 | 1.448* |
|  | (91.96) | (73.57) | (61.32) | (36.78) |

The use of 35 mm optics is a key feature in minimizing the size, weight and cost of the described optics requiring the light valve image designed dimension to be no greater than 42 mm (1.654 inches). Therefore, it is desirable to use a light valve imaging technology that provides the highest density of information content. It is likely that the light valve technology discussed herein is compatible with as-fabricated densities of 2000 dots-per-inch. This allows projection of high resolution images using compact, low cost and widely available optical components. The small size of the light valve allows the use of small format condenser lens assembly dichroic mirrors and prisms and projection lens. Subsequently, the package size of the described projector and monitor can be maintained at small dimensions and component weight is similarly minimized. Appropriate 35 mm format optical components are widely available and can be obtained at low cost relative to large and/or custom optical components. For projector and monitor requirements that cannot be met with a 35 mm compatible light valve, larger conventional or custom optical components may be employed. Due to the minimum size of a particular light valve format afforded by the described light valve technology, similar cost, size and weight advantages are translated to the procurement of custom optical components.

As has been described, the light valve technology described herein can be used to implement projection arrays of 1024×768 through 2048×2048 pixels using 35 mm format optical components. This permits the execution of high resolution color and monochrome image projectors and monitors at relatively compact dimensions and low weight.

Another feature of the present invention is that a projection display device employing single crystal silicon light valve matrices provides images with high brightness. To accomplish this, each single crystal silicon light valve matrix employed in a projection display device has a high optical aperture which is defined as the percentage of transparent area to total matrix area. Table 2 provides the optical aperture for various light valve arrays. It is noted that in general the minimum acceptable optical aperture for an array is 40%. As indicated by Table 2, as pixel density increases, which increases image resolution, optical aperture decreases. However, reducing the switching device size and/or the interconnect size for a given pixel density will increase the optical aperture.

TABLE 2

OPTICAL APERTURE COMPUTATIONS

| | | | | |
|---|---|---|---|---|
| Transistor length (um) | 3 | 3 | 3 | 3 |
| Transistor width (um) | 6 | 6 | 6 | 6 |
| Line width (um) | 2 | 4 | 6 | 8 |
| lines per inch | 1000 | 1000 | 1000 | 1000 |
| pixel size (um) | 25.4 | 25.4 | 25.4 | 25.4 |
| grid shadow (sq. um) | 97.6 | 187.2 | 268.8 | 342.4 |
| trans. shadow (sq. um) | 18 | 18 | 18 | 18 |
| pixel area (sq. um) | 645 | 645 | 645 | 645 |
| Packing Factor (%) | 85 | 85 | 85 | 85 |
| OPTICAL APERTURE (%) | 69.8 | 58.0 | 47.2 | 37.5 |
| Transistor length (um) | 3 | 3 | 3 | 3 |
| Transistor width (um) | 6 | 6 | 6 | 6 |
| Line width (um) | 2 | 4 | 6 | 8 |
| lines per inch | 800 | 800 | 800 | 800 |
| pixel size (um) | 31.8 | 31.8 | 31.8 | 31.8 |
| grid shadow (sq. um) | 123 | 238 | 345 | 444 |
| trans. shadow (sq. um) | 18 | 18 | 18 | 18 |
| pixel area (sq. um) | 1008 | 1008 | 1008 | 1008 |
| Packing Factor (%) | 85 | 85 | 85 | 85 |
| OPTICAL APERTURE (%) | 73.1 | 73.1 | 73.1 | 73.1 |
| Transistor length (um) | 3 | 3 | 3 | 3 |
| Transistor width (um) | 6 | 6 | 6 | 6 |
| Line width (um) | 2 | 4 | 6 | 8 |
| lines per inch | 1200 | 1200 | 1200 | 1200 |
| pixel size (um) | 21.2 | 21.2 | 21.2 | 21.2 |
| grid shadow (sq. um) | 80.7 | 153.3 | 218.0 | 247.7 |
| trans. shadow (sq. um) | 18 | 18 | 18 | 18 |
| pixel area (sq. um) | 448 | 448 | 448 | 448 |
| Packing Factor (%) | 85 | 85 | 85 | 85 |
| OPTICAL APERTURE (%) | 66.3 | 52.5 | 40.2 | 29.5 |
| Transistor length (um) | 3 | 3 | 3 | 3 |
| Transistor width (um) | 6 | 6 | 6 | 6 |
| Line width (um) | 2 | 4 | 6 | 8 |
| lines per inch | 2000 | 2000 | 2000 | 2000 |
| pixel size (um) | 12.7 | 12.7 | 12.7 | 12.7 |
| grid shadow (sq. um) | 46.8 | 85.6 | 116.4 | 139.2 |
| trans. shadow (sq. um) | 18 | 18 | 18 | 18 |
| pixel area (sq. um) | 161.3 | 161.3 | 161.3 | 161.3 |
| Packing Factor (%) | 85 | 85 | 85 | 85 |
| OPTICAL APERTURE (%) | 50.9 | 30.4 | 14.2 | 2.2 |

It is noted that light valve matrices having a diagonal of 1–2 inches do not require spacers in the liquid crystal volume. Because spacers are non-transmissive elements, eliminating them from the volume results in an improved optical aperture and thus increased brightness for the matrix and also prevents optical aberration caused by spacers at small pixel geometries.

Due to the higher intensities of light used in projection systems that are necessary to provide the desired brightness, the sensitivity of the single crystal pixel transistors to the light source can impair performance. The light source can be a halogen lamp that produces between 100 and 1000 watts and preferably operates in the range of 150–300 watts. Other lights such as discrete lasers (RGB), cathodoluminescent light sources, and arc-lamps producing similar levels of power per unit area can also be used.

It is therefore desirable to reduce the sensitivity of the active matrix to the light source. This is accomplished by shielding one or both sides of each transistor in the array with a light shield that will substantially attenuate the light directed or scattered toward each transistor. A metal or other optically opaque material can be used as a shield. When the shield is a metal it can also serve as an interconnect or a gate to the transistor being shielded. At normal incidence, a metal shield can completely attenuate light from the source at wavelengths at or above the silicon bandgap with thicknesses in the range of 2000–10,000 angstroms. Shielding can also be employed around the edge of the active matrix to attenuate or block light directed towards the peripheral circuitry.

The light valve image projector and monitor configurations can be used for the applications beyond image presentation. These include image generation and projection for electronic printing and photographic image recording. In the former, the light valve and image projection optics can be used to form an image on an electrophotographic media (as in the imaging drum of xerographic or laser printer processors). The key advantage is that the entire two-dimensional image can be exposed at once. For photographic applications, the image can be projected onto photographic film or paper.

Color can be implemented in the projector or monitor through the use of color filters, instead of dichroic mirrors. In one implementation, white light from a single or multiple lamps could be passed through each of red, green and blue filter to its incidence onto the appropriate color-assigned light valve. Alternatively, color filters can be fabricated directly on the light valve assembly. This can be done with a single color filter (e.g., red, green or blue) on a light valve or the specific alignment of color filters on the discrete elements constituting the light valve. The latter allows a color image to be obtained using a single light valve but forces a factor of 3 or 4 reduction in color pixel density as the elements are assigned a red, green, or blue filter or a red, green blue and white filter respectively. Alternatively, subtractive color filters (yellow, cyan and magenta) can be similarly used.

A key criterion in a preferred projector or monitor embodiment is the management of heat generated by the lamp light source. A significant portion of this heat is in the form of infrared (IR) radiation emanating from the lamp. Methods of controlling this IR radiation are its absorption by an IR filter or its reflection by an IR "heat mirror" that allows high transmission of visible light to the subsequent optics. Another method is the use of a dichroic mirror that separates the IR radiation from the visible light path and directs the IR to directly exit the projector or monitor housing.

A light valve panel formed by the described technology is compatible with 35 mm format optics. Therefore, this imaging device can be fabricated such that the assembled device has equivalent physical dimensions as a standard 35 mm photographic transparency whose image is projected via a conventional and generally available 35 mm "slide projector". Thus, an embodiment of the light valve projector is to use a single light valve matrix panel with integral drive electronics, as described herein, that is packaged to be size-equivalent with a standard mounted 35 mm transparency and to insert this modular electronic imaging device into a 35 mm "slide projector" without modification in order to generate the projected image. The light valve imaging device is connected by a cable to control electronics as are described herein. In this embodiment, a single light valve panel could generate a monochrome image or a color image through the use of applied color filters as described elsewhere herein. The light valve panel used for this embodiment can have the same fabricated element/pixel density as described for the other embodiments.

Figure 3:
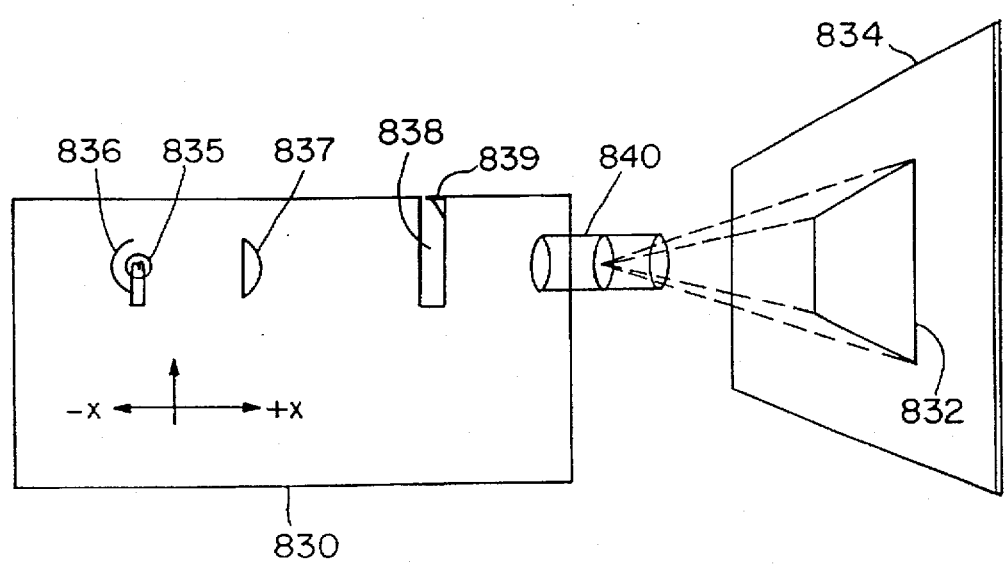
FIG. 3 is an illustration of a conventional slide projector.

Accordingly, other preferred embodiments of the present invention are directed to an active matrix (AM) display device adapted for use in a conventional 35 mm slide projector for providing monochrome or multi-color images. A conventional slide projector is illustrated in FIG. 3. The projector 830 produces from slide transparencies monochrome or multi-color images 832 that are projected to an enlarged surface 834 which may be a projection screen or any relatively flat surface.

Within the slide projector 830, light from a halogen lamp 835 is directed by a reflector 836 and an optional condenser lens 837 to slide chamber 838. The spherical reflector 836 collects light emitted in the −X direction and images the light of the lamp back onto itself. The condenser lens 837 is preferably designed for maximum collection efficiency for collecting light emitted in the +X direction. The white light from the lamp 836 is directed to a slide transparency (not shown) positioned in the slide chamber 838. The illuminating light is manipulated as it passes through the slide, producing an image which is directed to an optical system 840. The image is projected by the optical system 840 to the surface 834.

In accordance with the present invention, an active matrix display panel is adapted to be securely positioned in the slide chamber for selectively transmitting light from the lamp to provide monochrome or multi-color images to the optical system for projection onto a viewing surface. The basic components of the AM display panel include a first polarizing filter, a glass substrate, a transparent and conductive ITO coating, an epoxy adhesive, an active matrix circuit panel, a second transparent and conductive ITO coating, a glass superstrate and a second polarizing filter. These components are arranged in a layered structure and secured in a display panel housing dimensioned to fit securely in a 35 mm slide projector chamber. It is noted that the side walls of the housing, the ITO coatings and the superstrate provide electrical shielding for the active matrix circuitry. A liquid crystal material is placed in a volume between the circuit panel and the glass superstrate. Details for fabricating suitable active matrix display panels are provided in the incorporated applications.

An important feature of the active matrix display panel of the present invention is that it is compatible with existing slide projectors. The slide chamber 838 of an existing projector 830 is dimensional to accept a standard 2×2 inch slide having a thickness of up to ⅜ths of an inch. Because a standard 35 mm slide usually has a significantly smaller thickness, a spring-loaded slide holder 839 is provided to secure the slide in the chamber. In accordance with the present invention, an active matrix display panel assembly has a 2×2 inch face with a thickness of less than about ⅜ inch such that it can be securely positioned in a slide chamber without modification thereto.

The active matrix circuit panel 848 has an array of pixels or light valves 850 which are individually actuated by a drive circuit. The drive circuit includes circuit components that are positioned adjacent the array and electrically connected to the light valves for modulating the individual light valves so that the illuminating light may be selectively transmitted through the liquid crystal material to form a monochrome or multi-color image.

As noted above, the active matrix circuitry can be adapted to provide color images through the use of color filters. In one embodiment, white light from the projector light source can be passed through each of a stacked arrangement of red, green and blue filters to the appropriate color assigned light value. Alternatively, a color filter can be fabricated directly onto each light valve and the light valves are arranged by filter color to provide uniform color images. For example, pixels can be arranged in a triad arrangement where three color filters are employed or the pixels can be arranged in a quad arrangement where four filters are employed.

In preferred embodiments, the active matrix circuit panel circuitry is formed in or on a layer of a semiconductor material such as silicon. It is noted that any number of fabrication techniques can be employed to provide preferred thin-films of polysilicon or single crystal silicon. In embodiments in which the active matrix is formed in a thin-film of single crystal silicon, any of the previously mentioned pixel densities can be provided such that high resolution images are produced. Other preferred embodiments employ the use of a solid state material or any material whose optical transmission properties can be altered by the application of an electric field can be used to supply the light valves for the AM display panel of the present invention.

Figure 4A:
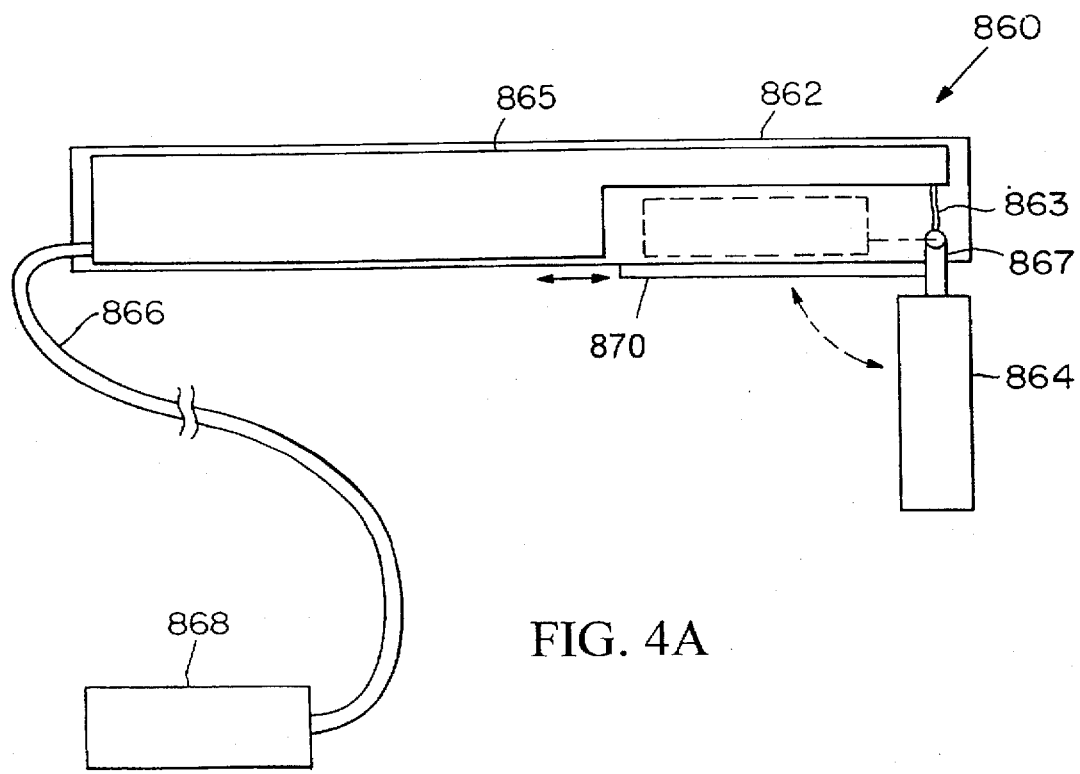
FIGS. 4A–4B illustrate a preferred embodiment of an active matrix display device employed in a conventional slide projector.
Figure 4B:
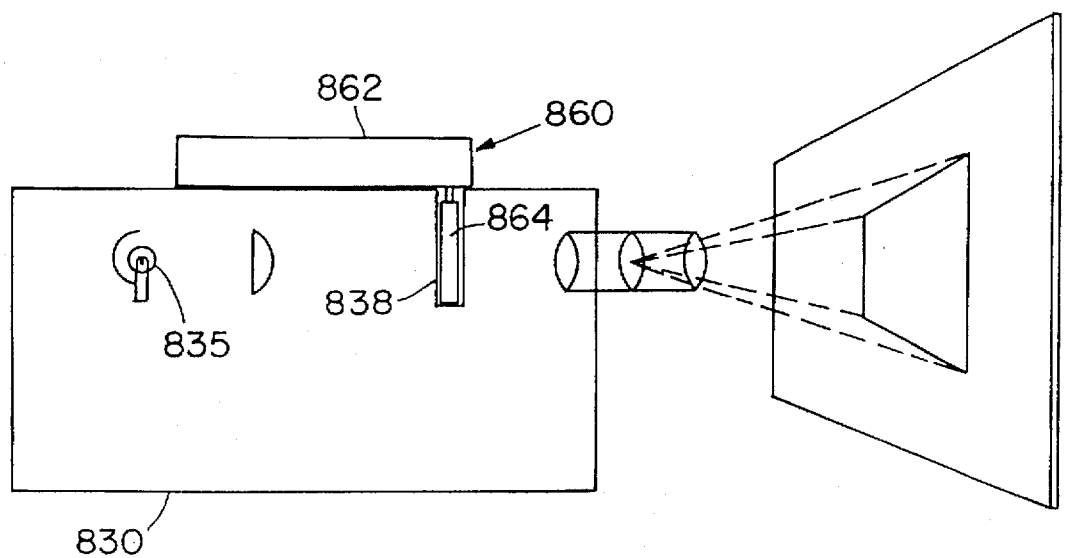

A preferred embodiment of an active matrix display device for use with a slide projector is illustrated in FIGS. 4A–4B. Referring to FIG. 4B, the display device 860 includes a housing 862 and an active matrix display panel 864. The housing 862 is positioned on the slide projector 830 so that the display panel 864 is securely disposed in the slide chamber 838. Referring to FIG. 4A, the display panel 864 is rotatably mounted to the housing 862 by an arm 867. As such, the display panel 864 has a storage position (dashed lines) and an operating position. When the display panel 864 is rotated into the operating position, the sliding shielded cover 870 is moved into a closed position (as shown) for sealing the housing.

The housing preferably contains a shielded electronics assembly 865 which is electrically connected to the display panel 864 by a cable 863. The electronics assembly 865 has an input cable (or connector) 866 for connecting to an image generation device 868 which may be a computer or any video device. Image data provided by the device 868 is processed by the electronics 865 and sent to the drive circuitry of the AM display panel 864. Responsive to the received data, the drive circuitry modulates the individual active matrix light valves such that the illuminating light from the light source 835 is selectively transmitted through the display panel to form monochrome or multi-color images.

Figure 5:
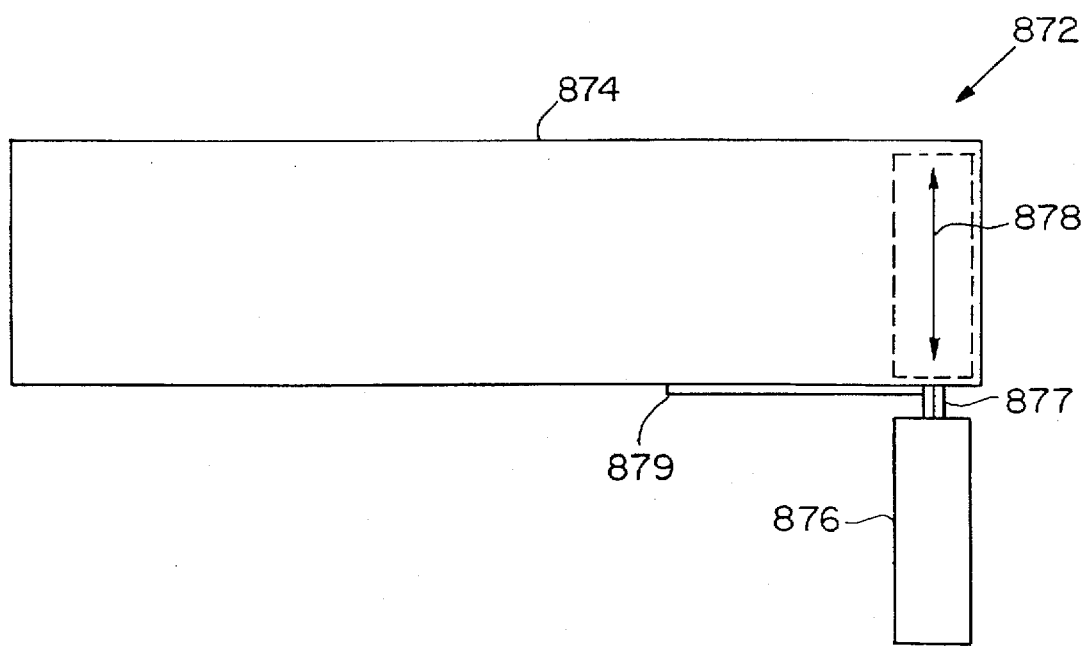
FIG. 5 is an illustration of another preferred embodiment of an active matrix display device employed in a conventional slide projector.

Another preferred embodiment of an active matrix display device is illustrated in FIG. 5. The display device 872 includes an electronics housing 874 and an active matrix display panel 876 translatably mounted to the housing by a spring-loaded arm 877. As such, the display panel 876 has a storage position (dashed lines) in the housing 874 and an operating position located along a vertical axis 878.

The display panel 876 is moved into the operating position such that it can be positioned in the chamber of a slide projector (not shown). With the display panel 876 in the operating position, the shielded cover 879 is moved along an axis orthogonal to the vertical axis 878 into a closed position (as shown) for sealing the housing. Alternatively, a cover can be attached to arm 877 such that when the display panel 876 is moved to the operating position, the opening in the housing 874, through which the display panel 876 is moved, is sealed by the cover. In another embodiment, the display panel 876 is mounted on a track on the internal walls of housing 874 and is moved into the operating position by sliding along the track.

Figure 6A:
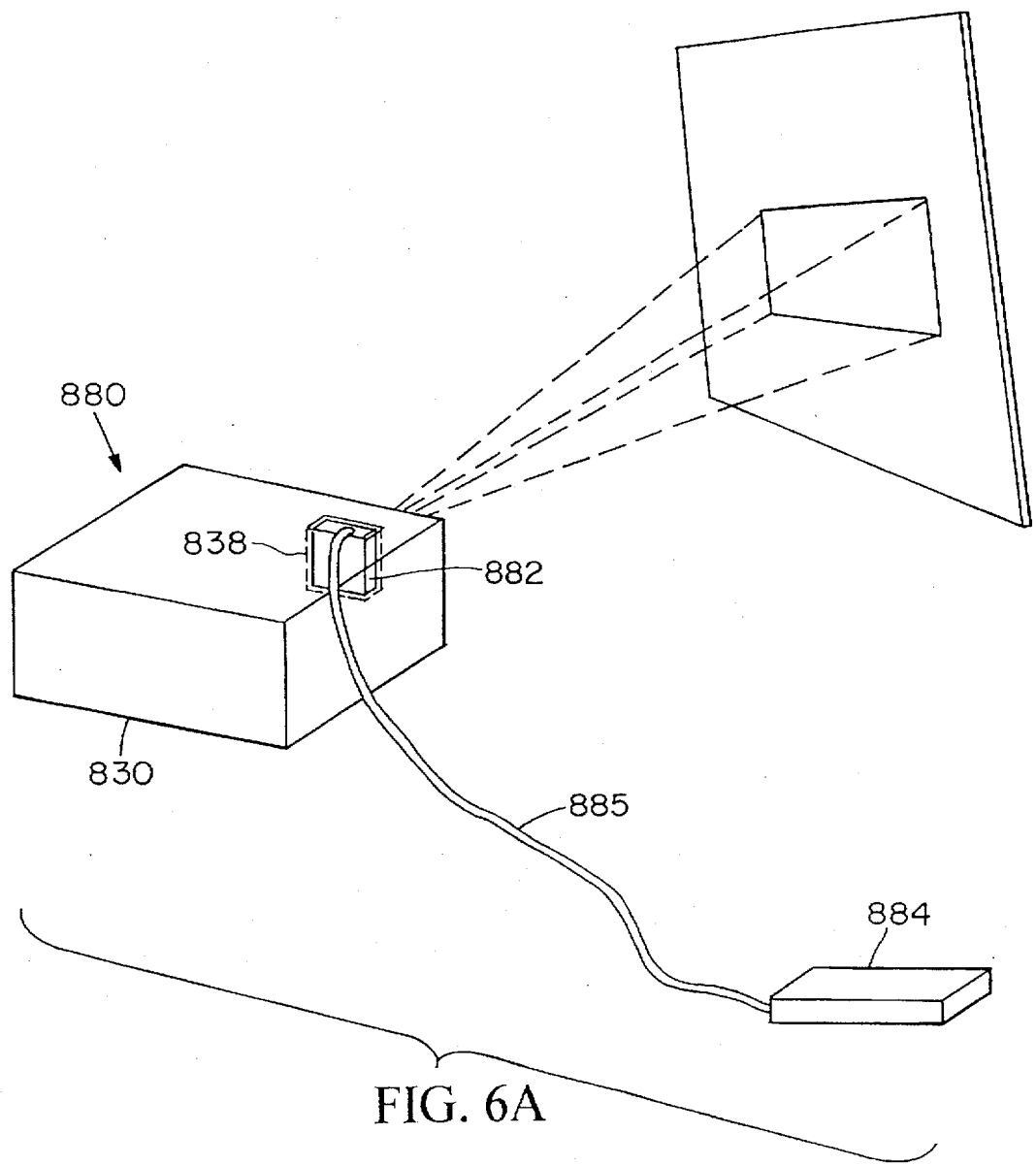
FIG. 6A is a perspective view of another embodiment of an active matrix display device of the present invention.

In another preferred embodiment shown in FIG. 6A, an active matrix display device 880 includes an AM display panel 882 and a remote electronics housing 884. The display panel 882 is dimensioned to be securely positioned in the chamber 838 of the slide projector 830. The display panel 882 is electrically connected to electronics in the remote housing 884 by a cable 885.

Figure 6B:
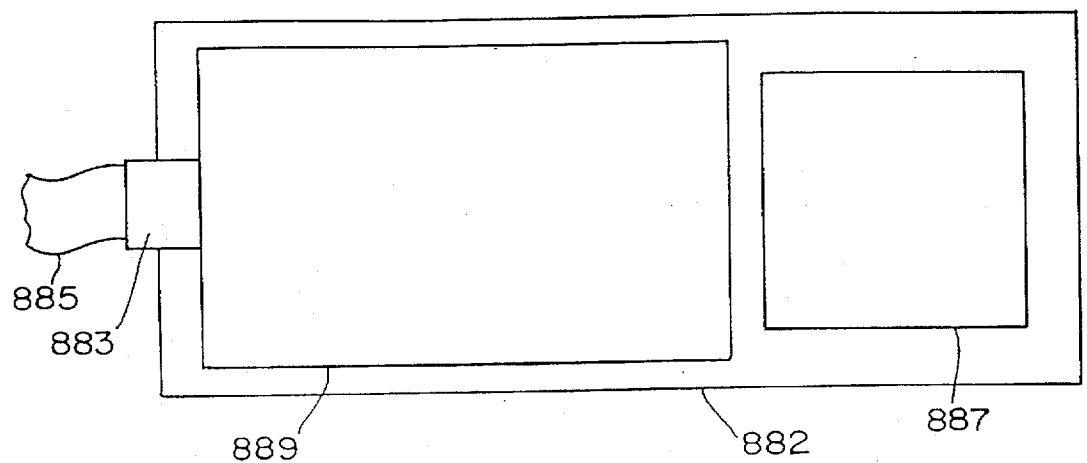
FIG. 6B is a plan view of an active matrix and collocated driver/signal processing circuitry for the active matrix display panel of FIG. 6A.

Referring to FIG. 6B, the housing (not shown) is connected to an image generation device (not shown) which may be a computer or any video device. Image data provided by the device is received by the electronics in the housing at connector 883 and sent to the drive/signal processing circuitry 889 (described below) on the AM display panel 882. Responsive to the received data, the circuitry 889 modulates the individual light valves of the active matrix 887 for providing monochrome or multi-colored images.

Figure 7:
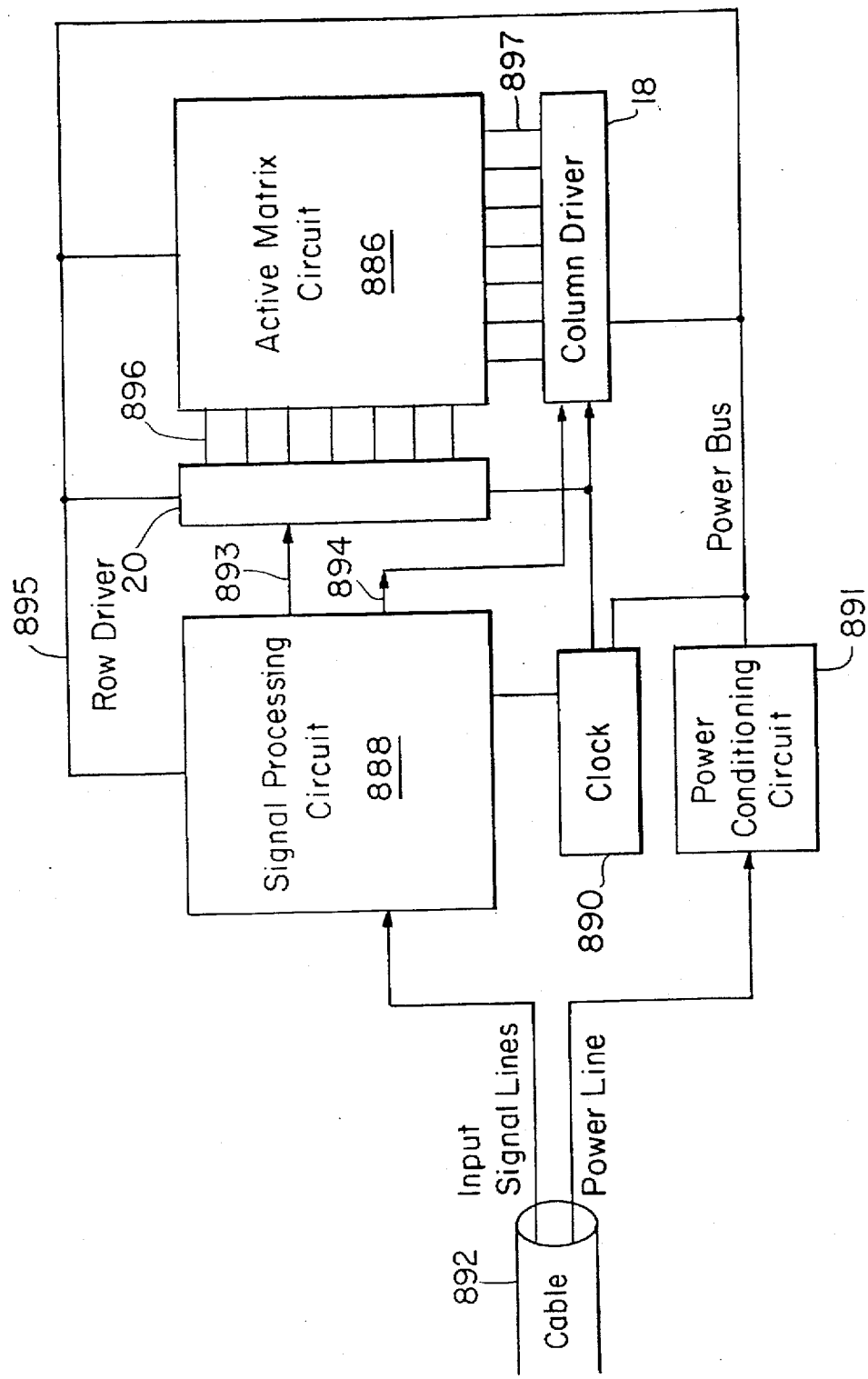
FIG. 7 is a circuit diagram illustrating a preferred driver system for an active matrix display device.

Preferred embodiments of the active matrix display device (FIGS. 4A, 5 and 6A) include a driver circuit 889 for selectively actuating the active matrix light valves as shown in FIG. 7. Referring to FIG. 7, the active matrix comprises a plurality of light valves which are individually actuated by collocated driver circuitry 886. The collocated driver circuitry is controlled by supporting driver circuitry which includes a signal processing circuit 888, a system clock 890, a power conditioning circuit 891, column drivers 18, and row drivers 20.

The signal processing circuit 888 receives via the cable 892 an input signal which may be an RGB signal, an NTSC signal, an S-Video signal or other video format signal, or any digital or analog signal. The signal processing circuit processes the incoming signal and (for a multi-color active matrix) produces separate video output signals for each primary color and synchronization signals for the column and row drivers. These signals are provided to the column driver (via bus 893) and row driver (via bus 894). The video output signal on line 895 is a serial data stream wherein the amplitude of each signal of the data stream determines the intensity of light transmitted through each light valve. Alternatively, the video output signal may be a digitally formatted data stream indicative of the light intensity. Preferably, the video output signal is VGA compatible, providing a data rate of up to 32 Mbps.

The serial data stream on line 895 is received by the row drivers 18. The row drivers send each of the signal data streams to the light valves through buses 896. The column drivers 20, responsive to the sync signal, send a signal through buses 897 to turn on individual transistors allowing the associated signal of the data stream to charge the capacitor in each pixel. The capacitor sustains a charge, which is proportioned to the amplitude of the associated signal on the light valve until the next scan of the array.

Figure 8:
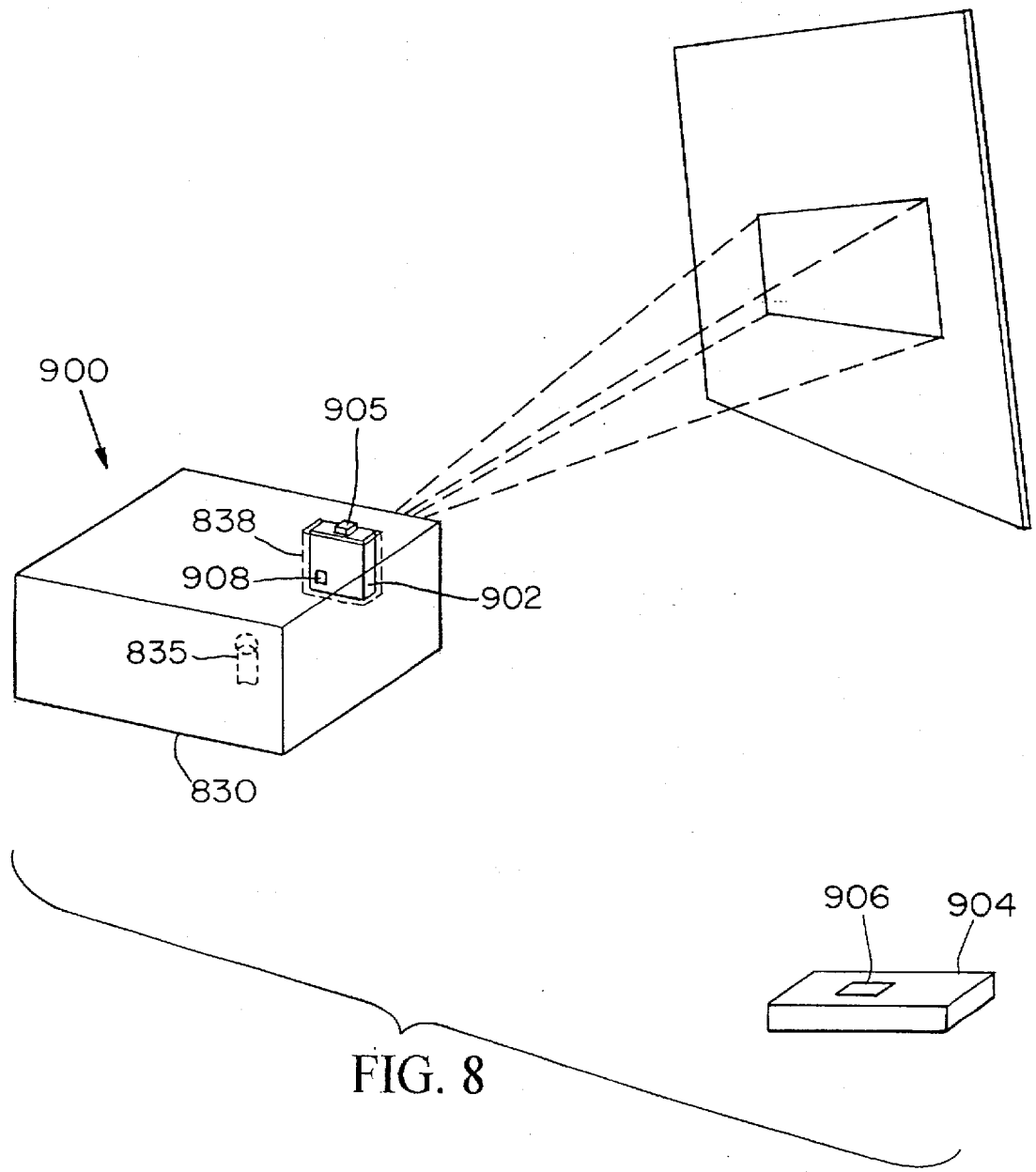
FIG. 8 is a perspective view of another embodiment of an active matrix display device of the present invention.

In another preferred embodiment shown in FIG. 8, an active matrix display device 900 includes an AM display panel 902 and a remote electronics housing 904. The display panel 902 is dimensioned to be positioned in the chamber 838 of a 35 mm slide projector 830. In contrast to previously described embodiments, the display panel 902 is not physically connected to the electronics housing 904. Instead, the slide and the electronics in the housing 904 communicate with each other via antennas elements 905 and 906 respectively. In preferred embodiments, the antennas can be a pair of RF antennas or an infrared transmitter element such as an infrared LED paired with an infrared receiver element which can be a photodiode elements. The antenna 905 can be integrated into a handle (not shown) to provide for manual insertion and removal from chamber 838.

Figure 9A:
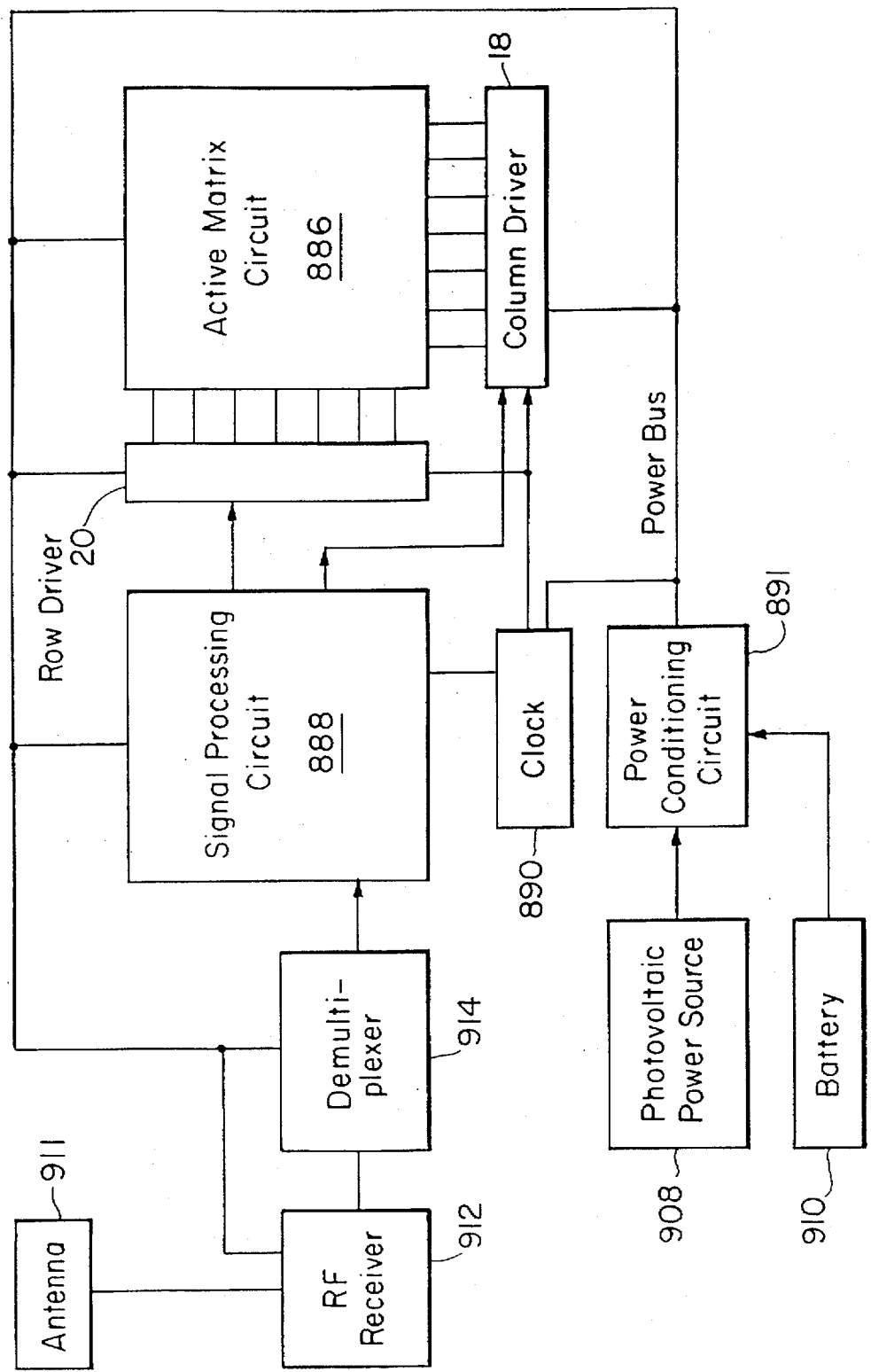
FIGS. 9A–9B are circuit diagrams illustrating two preferred driver systems for the active matrix display device of FIG. 33.
Figure 9B:
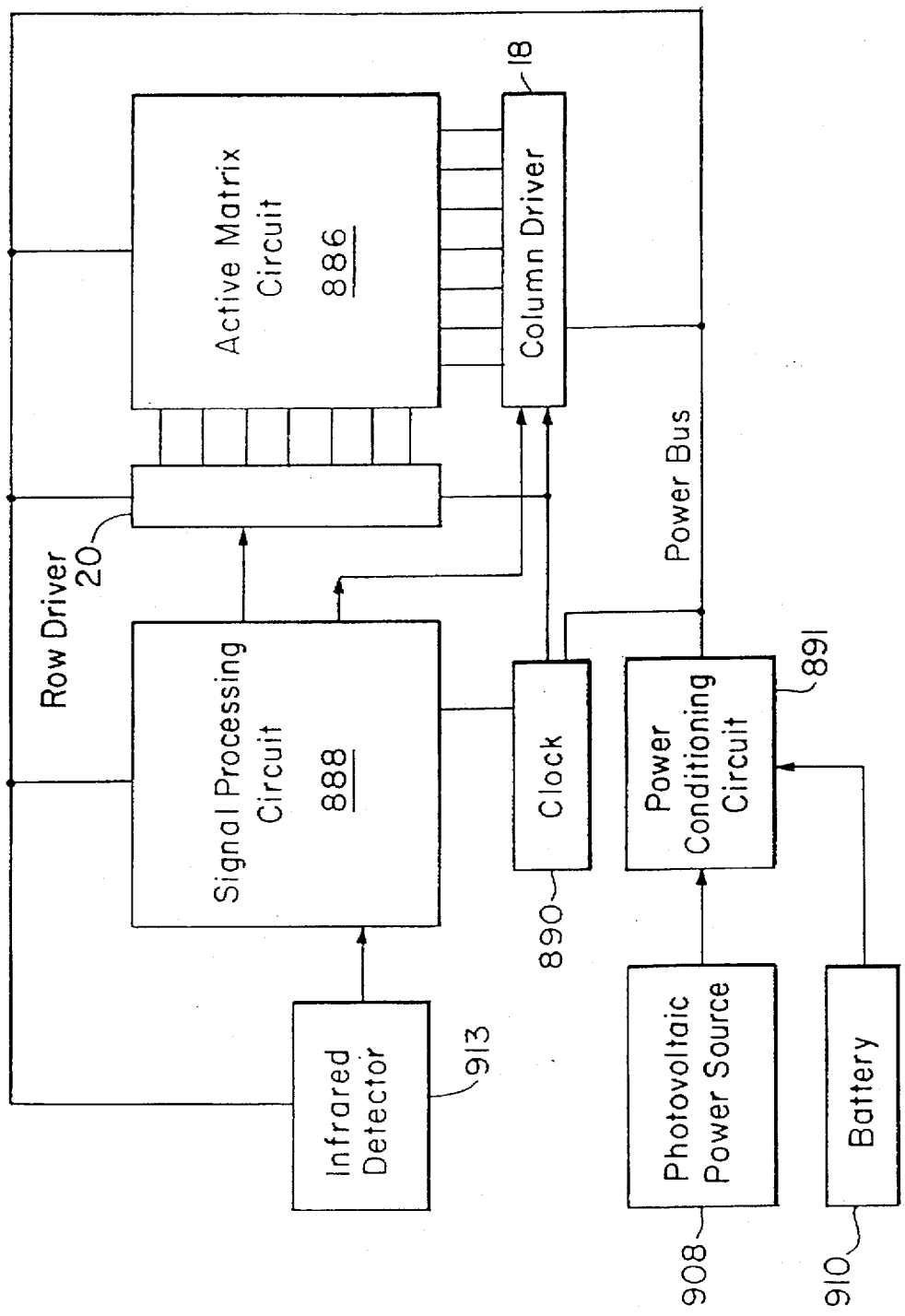

Driver circuitry for the active matrix display device of FIG. 8 is illustrated in FIGS. 9A–9B. Referring to FIG. 9A, the driver circuitry includes the signal processing circuit 888, the system clock 890, the power conditioning circuit 891, column drivers 18, row drivers 20, a photovoltaic power source 908, a battery 910, an RF receiver 912 and an demultiplexer 914. The RF receiver 912 receives a stream of RF signals from the antenna 911. A demultiplexer 914 formats the RF signal stream such that it is can be processed by the previously-described signal processing circuit 888. The battery 910 and the photovoltaic power source 908, either individually or together, provide power to support the operations of the active matrix display circuitry. The photovoltaic power source 908 can use slide projector light source energy to provide power to the active matrix display panel and is therefore mounted onto the display panel outer surface facing the light source (shown in FIG. 8).

Referring to FIG. 9B, the driver circuitry includes the signal processing circuit 888, the system clock 890, the power conditioning circuit 891, column drivers 18, row drivers 20, a photovoltaic power source 908, a battery 910 and an infrared detector photodiode 913. The photodiode 913 receives infrared signals from the electronics (not shown) which are processed by the signal processing circuit 888.

Figure 10:
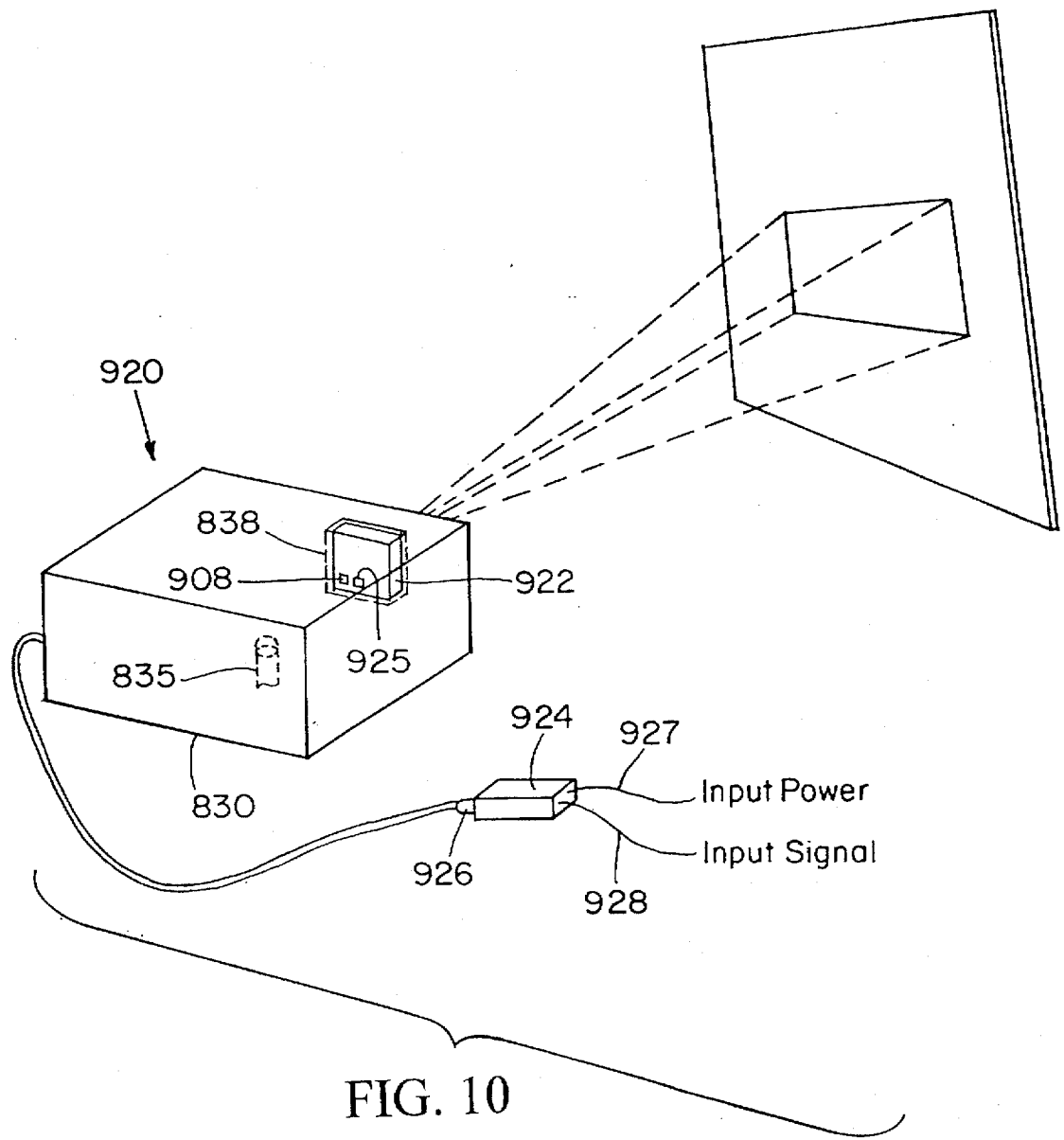
FIG. 10 is a perspective view of another embodiment of an active matrix display device.

In another preferred embodiment shown in FIG. 10, an active matrix display device 920 includes an AM display panel 922 and an adapter unit 924. The display panel 922 is dimensioned to be securely positioned in the chamber 838 for receiving light generated by the light source 835. A photovoltaic power source 908 is located on the display panel 922 facing the light source 835 to provide power to the active matrix. The slide projector includes a plug 926 which is typically plugged into an electrical outlet (not shown) to receive electrical energy to power the projector light source 835. However, in this embodiment, the plug 926 is plugged into the adapter unit 924 to receive electrical energy.

The adapter unit receives electrical energy via the input power line 927 and image information via the input signal line 928. The adapter unit houses supporting electronics which couples encoded signals representing the received image information into incoming electrical energy received on line 927. The electrical energy with encoded image signals is directed to the plug 926 for providing power to the projector. The light source 835 converts some of the received electrical energy into light which is directed to the active matrix display panel. As such, the encoded image signals are transmitted to the display panel by the light source. A detector 925 is positioned on the display panel for receiving the encoded signals.

Figure 11:
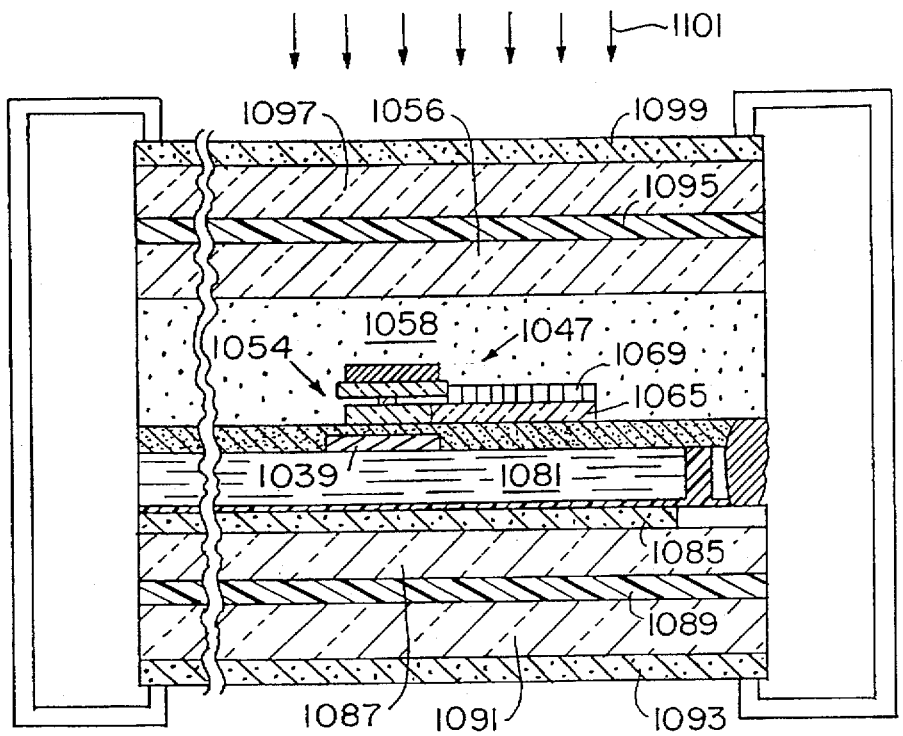
FIG. 11 is a cross-sectional view of a preferred active matrix color display structure.

A partial cross-sectional view of another active matrix color display device is shown in FIG. 11. Each pixel electrode 1065 is laterally spaced from the counterelectrode 1085. Each pixel element 1047 will have a transistor 1054, a pixel electrode 1065 and an adjacent color filter element 1069 associated therewith. Polarizing elements 1089, 1095 are positioned on opposite sides of the structure. The display also includes the bonding element or adhesive 1058, an optically transmissive substrate 1056, optically transmissive layers (1087, 1091, 1097) and ITO layers (1093, 1099). The structure is completed by positioning a light source for providing light 1101 adjacent to the ITO layer 1099.

Figure 12:
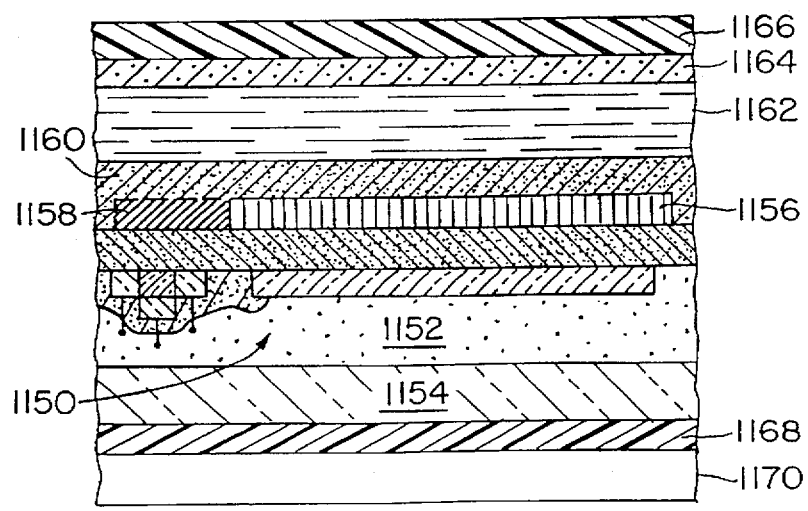
FIG. 12 is a cross-sectional view of another preferred transmissive active matrix color display.

A cross-sectional view of another active matrix display is shown in FIG. 12. A liquid crystal material 1162 is positioned in close proximity to the pixel elements 1150. An insulating layer 1160, which can be $SiO_2$, polyamide or sputtered glass, is formed over each pixel element for passivating the pixel elements from the liquid crystal material 1162. A counterelectrode 1164 is laterally spaced from the pixel electrodes 1148. Each pixel element 1150 has a transistor 1146, a pixel electrode 1148 and an adjacent color filter element 1156 associated therewith. Polarizing elements 1164, 1168 are positioned on opposite sides of the structure. The structure is completed by positioning a back light source 1170 adjacent to the polarizing element 1168.

Another feature of the active matrix displays of the present invention is that an array of pixel electrode elements can be patterned in the single crystal silicon material. In one preferred embodiment, the individual pixel electrode elements are solid shaped elements formed of single crystal silicon or indium tin oxide (ITO). In another embodiment, the pixel electrodes can be selectively thinned to optimize transistor performance. Regions of the electrode can be thinned to about one-tenth the thickness of the 0.1 to 2.0 micron single crystal silicon layer.

In yet another embodiment, the silicon material is patterned to form an array of pixel electrodes and each electrode is further patterned into a grid, serpentine, or other suitable geometry to reduce transmission loss through the pixel electrode. This provides an aperture through each pixel electrode that improves transmission of light by reducing interference effects and also reducing reflection, absorption and scattering caused by the pixel material. One advantage of the grid-shaped pixels is the increased light transmission through the active matrix which results in brighter displayed images. Another advantage is that the grid-shaped pixels minimize thickness variations in the single crystal silicon layer. These thickness variations cause light absorption or interference which reduces the light transmission through the active matrix. By minimizing thickness variations, brighter displayed images can be provided. An alternative embodiment includes further thinning of the pixel electrode material so the switching circuits are within a thicker film than the pixel electrode.

FIGS. 13A–13D illustrate external feature of a slide projector mountable light valve display housing 100 according to a preferred embodiment of the invention. The housing 100 is adapted to be mounted to a commercially available slide projector. Commercially available slide projectors are available from Vivatar, Kodak, Agfa, and other manufacturers. A particular preferred embodiment of the invention will be described in relation to a Kodak carousel slide projector. It being understood that other slide projectors can be used with minor structural changes to the housing 100.

FIG. 13A is a right-side perspective view of a preferred embodiment of a slide projector mountable light valve display housing 100. Illustrated is the housing body 110, a top control panel 112, a base 141, and a manual release access door 150. An infrared receiving element 114 is visible on the housing body 110. The control panel 112 contains a plurality of raised buttons 181 and a power indicator 183, such as an LED. The housing base 141 contains a frame tab channel 146 and a mounting lip 148. The housing 100 is ergonomically designed for an average human hand.

FIG. 13B illustrates a bottom plan view of the housing 100. A spindle mount 145 registers to the center hub of a slide projector. After the spindle mount 145 is mounted on the center hub, the housing 100 is rotated into position on the slide projector. A spindle tab cutout 147 and clip 146 are adjacent to the spindle mount 145 and registers to a spindle tab on the projector spindle. Once the housing 100 has been rotated into position, the mounting lip 148 registers to the slide projector housing. The mounting lip 148 also contains a mounting slot 149, which registers to a remote control unit (discussed below). Also shown is an opening to a slide channel 143 through which a light valve assembly extends and retracts. The clip secures the housing to the center hub, once the housing 100 has been rotated into position. A remote control release 170 registers to the remote control unit. The clip 146 acts as a spring acting against the remote control release 170.

FIG. 13C is a rear view of the housing 100. Registered to the housing body 110 is an external interface plate 160 and the remote control release 170. The external interface plate 160 contains a power connector cutout 162 and a video signal connector cutout 164.

Figure 13D:
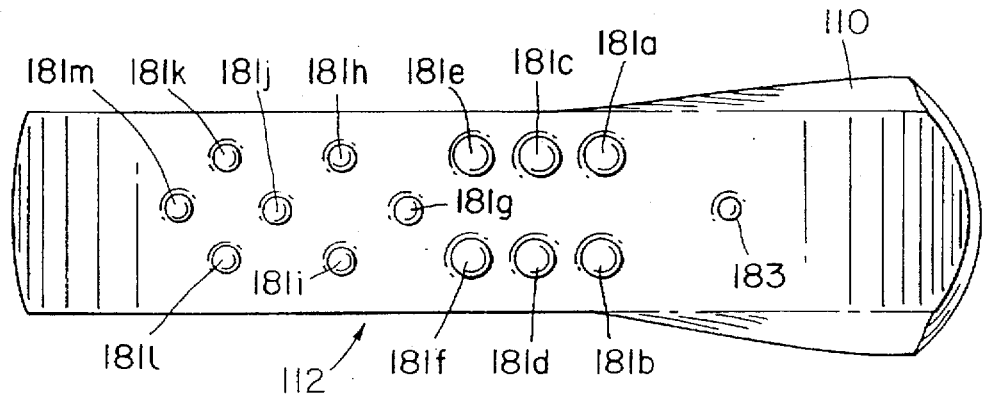

FIG. 13D is a top plan view of the housing 100. Shown are the elevated control buttons 181 and the power indicator 183. The control buttons allow the user to control brightness 181a, 181b, contrast 181c, 181d, and tuning 181e, 181f (i.e., pixel centering). A graphics/text button 181g allows the user to switch between graphics and text displays on an MS-DOS computer. Frame buttons 181j, . . . , 181m allow the user to shift the display up, left, right and down, respectively, by whole pixel increments. A save button 181h saves the current setting for the current video mode. A reset button 181i returns the settings to factory default settings. Details of the control button function are discussed in the U.S. patent application Ser. No. 08/106,416, entitled "Control System For Display Panels" by Matthew Zavracky et al. and filed on Aug. 13, 1993, incorporated herein by reference. Each control panel button 181 is formed from a rubberized button insert (not shown), which is registered to a control panel contact pad insert (not shown).

Figure 14B:
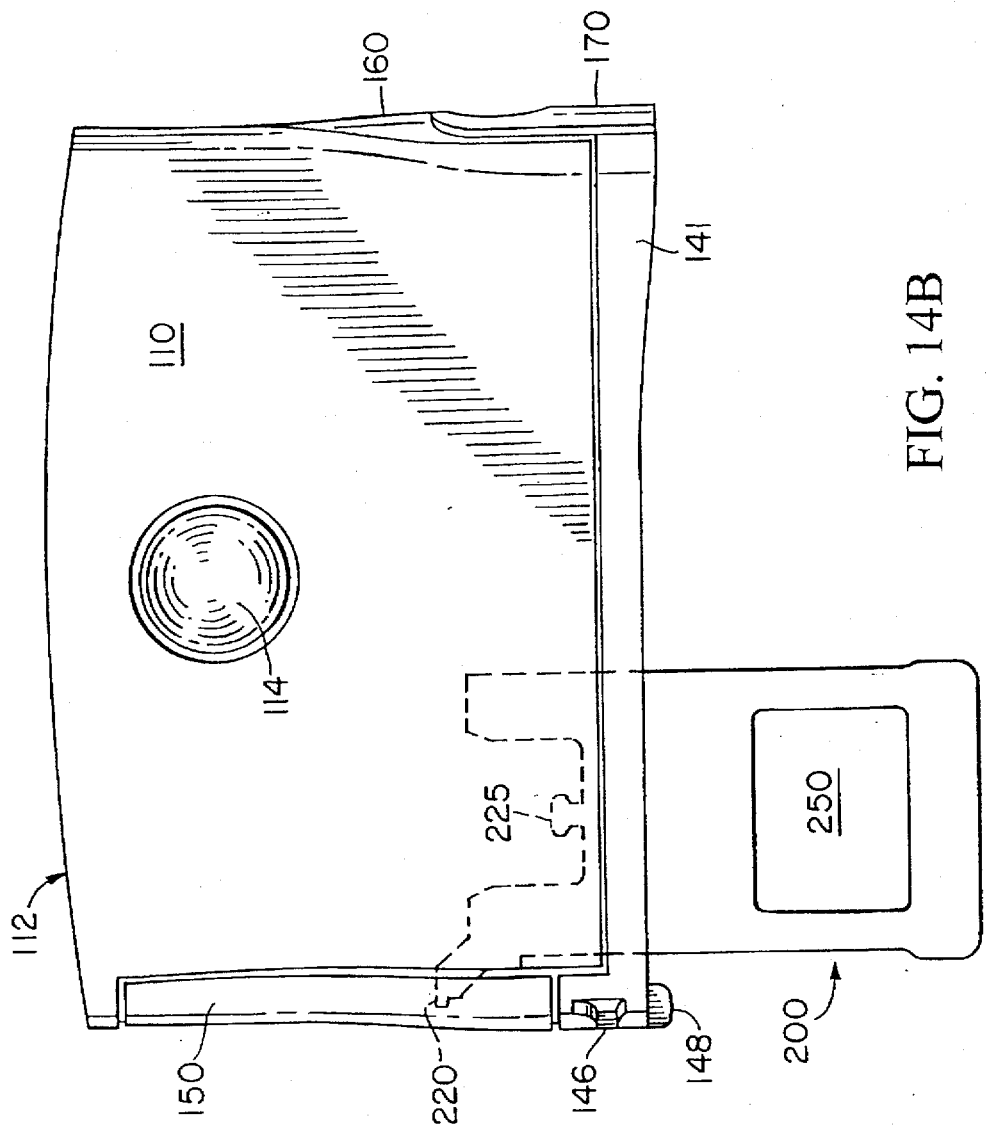
FIGS. 14A–14B illustrate a preferred embodiment of the light valve housing with the light valve assembly extended.
Figure 14A:
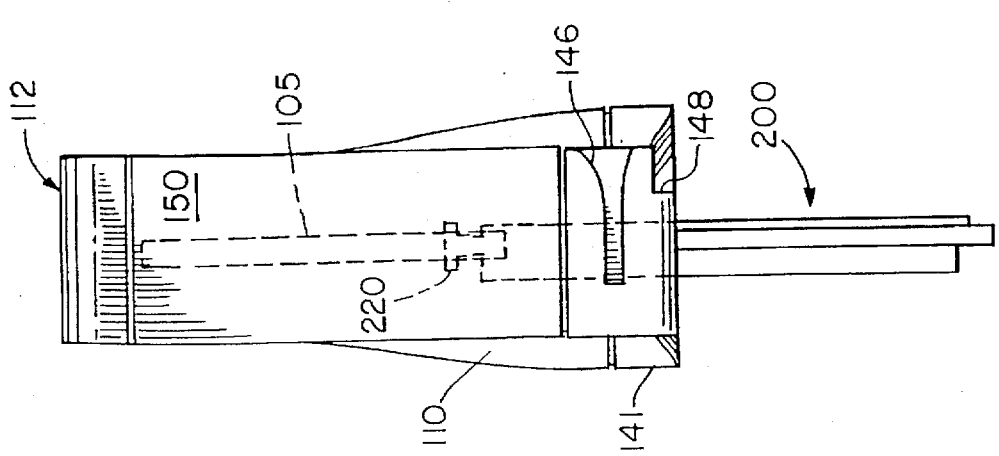

FIG. 14A is a front plan view of the housing 100 with a light valve assembly 200 in the extended position. Located behind the access door 150 is a handle slot 105 (shown in phantom). A slide handle 220 (shown in phantom) extends through the handle slot 105 and moves relative to the handle slot 105 as the light valve assembly 200 is moved within the housing 100.

FIG. 14B is a right-side plan view of the housing 100 with the light valve assembly 200 in the extended position.

Figure 15:
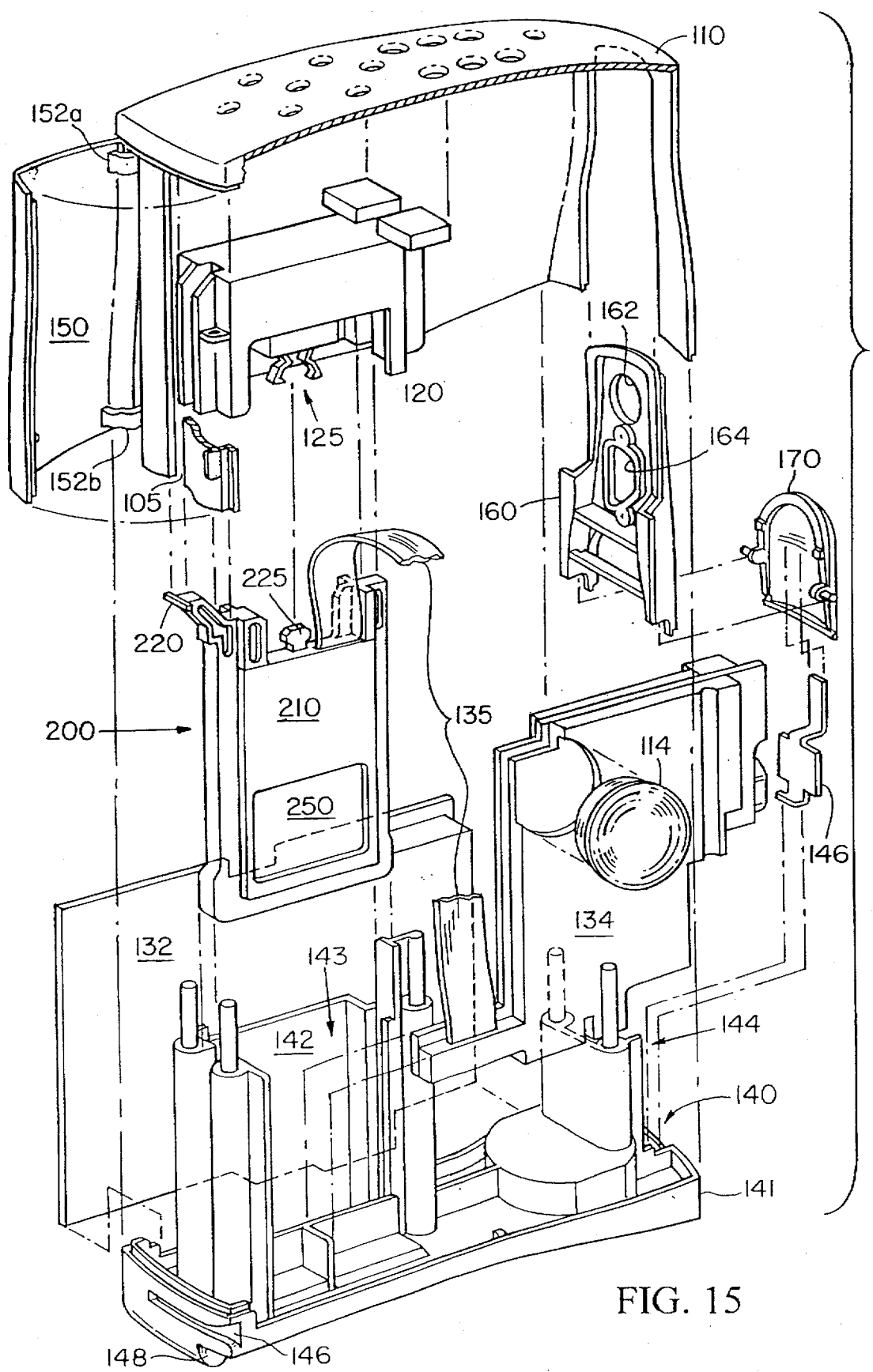
FIG. 15 is an exploded view of a preferred embodiment of a display unit.

FIG. 15 is an exploded view of a preferred display unit. A housing base 140 contains much of the structural elements of the housing 100. In particular, a front superstructure 142 includes a slide channel 143 for the light valve assembly 200 and provides structural support for the front of the housing 100. In addition, a rear superstructure 144 is mounted to the topside of the spindle mount 145 to provide structural support for the rear of the housing 100.

The light valve assembly 200 moves freely through the slide channel 143. A latch holder 120 registers to the slide channel 143. The latch holder 120 includes a latch mechanism 125. The latch mechanism 125 meets with a latch tab 225 of a light valve assembly frame 210. When the light valve assembly 200 is fully retracted into the housing 100, the latch mechanism 125 secures the latch tab 225 so the light valve assembly 200 is fixed to the housing in the retracted position. The latch mechanism 125 is of a type that releases the latch tab 225 when an upward pressure is placed on the light valve assembly 200. After being released, the light valve assembly 200 descends through the slide channel 143. Preferably, the light valve assembly 200 is gravity fed.

During operation, it is possible that the light valve assembly 200 may jam while extended into the projection chamber 16. For that reason, the slide handle 220 can be accessed through the manual release access door 150, which is mounted to the housing body 110 by hinges 152a, 152b. By using the slide handle 220, a user can manually raise or lower the light valve assembly 200.

A light valve display panel 250 is coupled to video control circuitry 132, 134. As illustrated in FIG. 15, the video control circuitry is provided by a digital circuit board 132 and analog circuit board 134. In particular, the analog circuit board 134 is a daughter board connected to the digital circuit board 132. These circuit boards 132, 134 are adapted to fit within the housing 100. The analog circuit board 134 receives power from an external power source and analog video signals from an external video source through power cutout 162 and video connector cutout 164, respectively. Preferably, the video source is a computer that generates video images, but the video source can generate a composite video signal or an S-video signal. There can be multiple video connections for various video input signals. The analog circuit board 134 also receives user control signals from the control panel 12 and the remote control unit 300. The digital circuit board 132 performs digital processing of the video signal. The drive signals for the light valves are provided by the analog circuit board 134 over a ribbon cable 135.

Figure 16A:
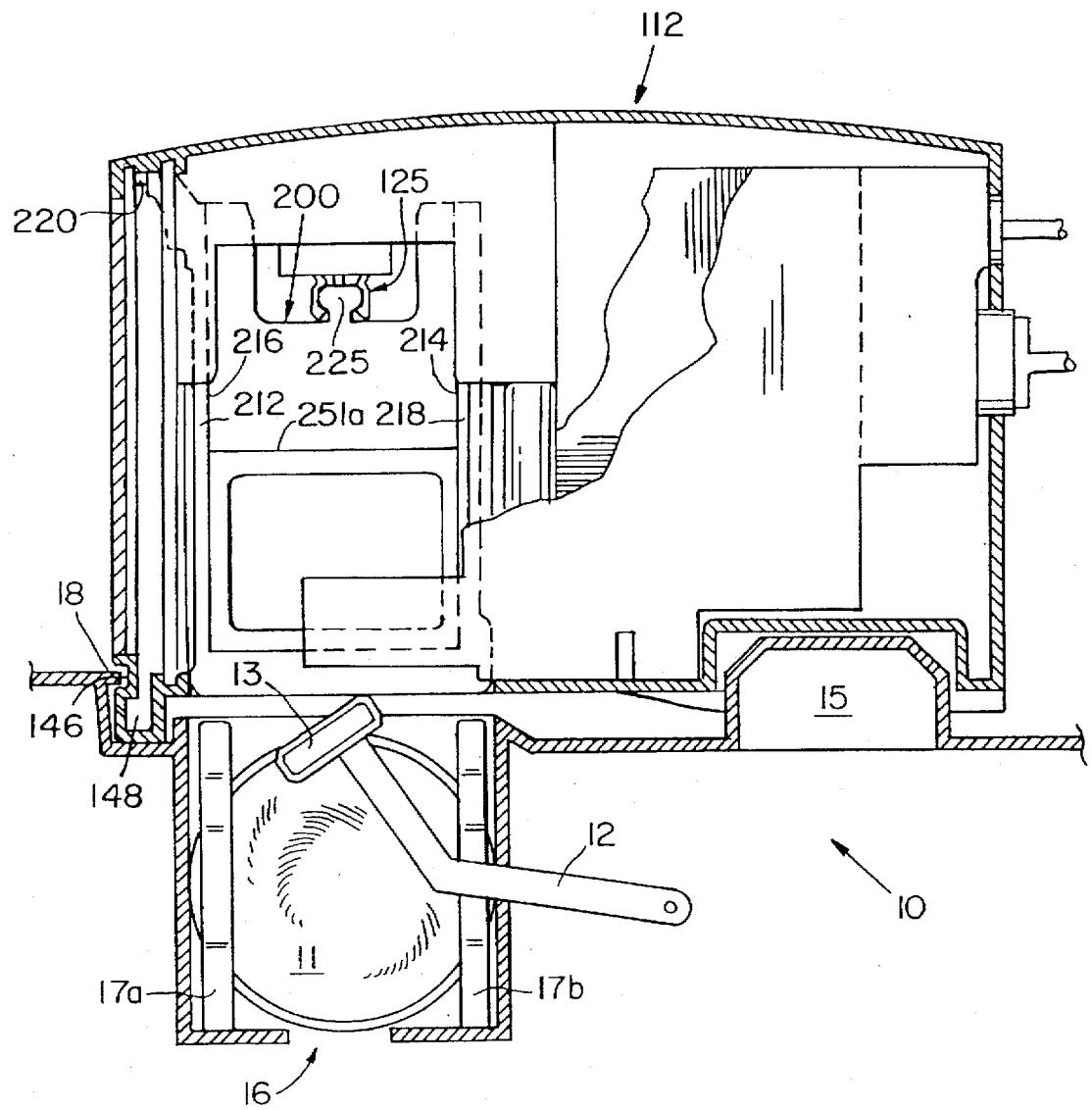
FIGS. 16A–16B are sectional views of a preferred light valve display unit mounted on a standard slide projector.

FIG. 16A illustrates the housing 100 properly aligned in the locked position with the light valve display panel assembly 200 aligned directly above a projection chamber 416 of a projector 410. Once positioned and locked, the light valve slide assembly 200 is ready to be lowered into the projection chamber 416. By advancing the slide projector, an ejector arm 412 is raised such that a slide bumper 415 contacts the light valve 200. The upward motion of the ejector arm 412 urges the light valve assembly 200 vertically upward causing the latch mechanism 125 to disengage latch tab 225. After being released from the latch mechanism 125, the light valve assembly 200 is supported by the slide bumper 413. The ejector arm 12 then continues to cycle downward to lower the light valve assembly 200 into the projection chamber 416. The light valve assembly 200 is secured by spring clips 417 in the projection chamber 416. Because of friction between the light valve assembly 200 and the slide channel 143, the light valve assembly may drop into the projection chamber 416 after the ejector arm 412 has finished the ejection cycle. On the next ejection cycle, the light valve assembly 200 will be forced upward by the ejector arm 412 to be secured by the latch mechanism 125.

Figure 16B:
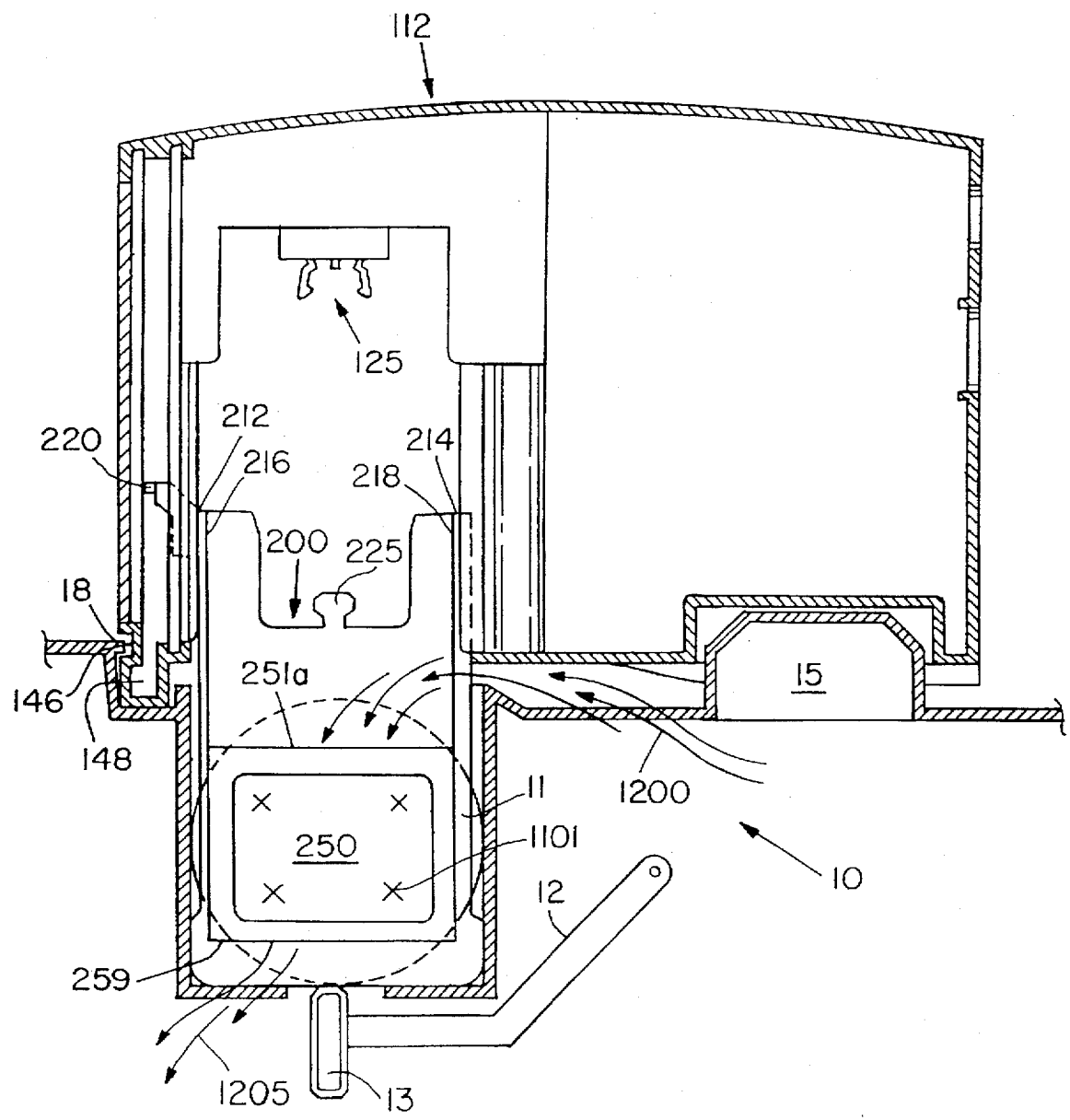

FIG. 16B illustrates the light valve assembly 200 positioned and retained in the projection chamber 416 of a slide projector 10, such that light 1101 from a light source (not shown) passes through the light valve 250 and is projected onto a viewing surface by a projection lens 411. While the light valve slide assembly 200 is positioned in the projection chamber 416, the light valve and associated circuitry are exposed to heat from the projector light source. Adequate ventilation must be provided to reduce the exposure of the light valve to excessive heat.

Ventilation is preferably provided through the underside of the housing 100. Cool air 1200 is drawn into the projection chamber 416 by a circulating fan (not shown) of the slide projector. The cool air 1200 is drawn through a ventilation channel 259 of the light valve slide assembly 200. Warm exhaust air 1205 exits the ventilation channel 259 and is expelled by the projector circulating fan. The physical characteristics of the ventilation channel 259 will be discussed in more detail below.

Figure 17A:
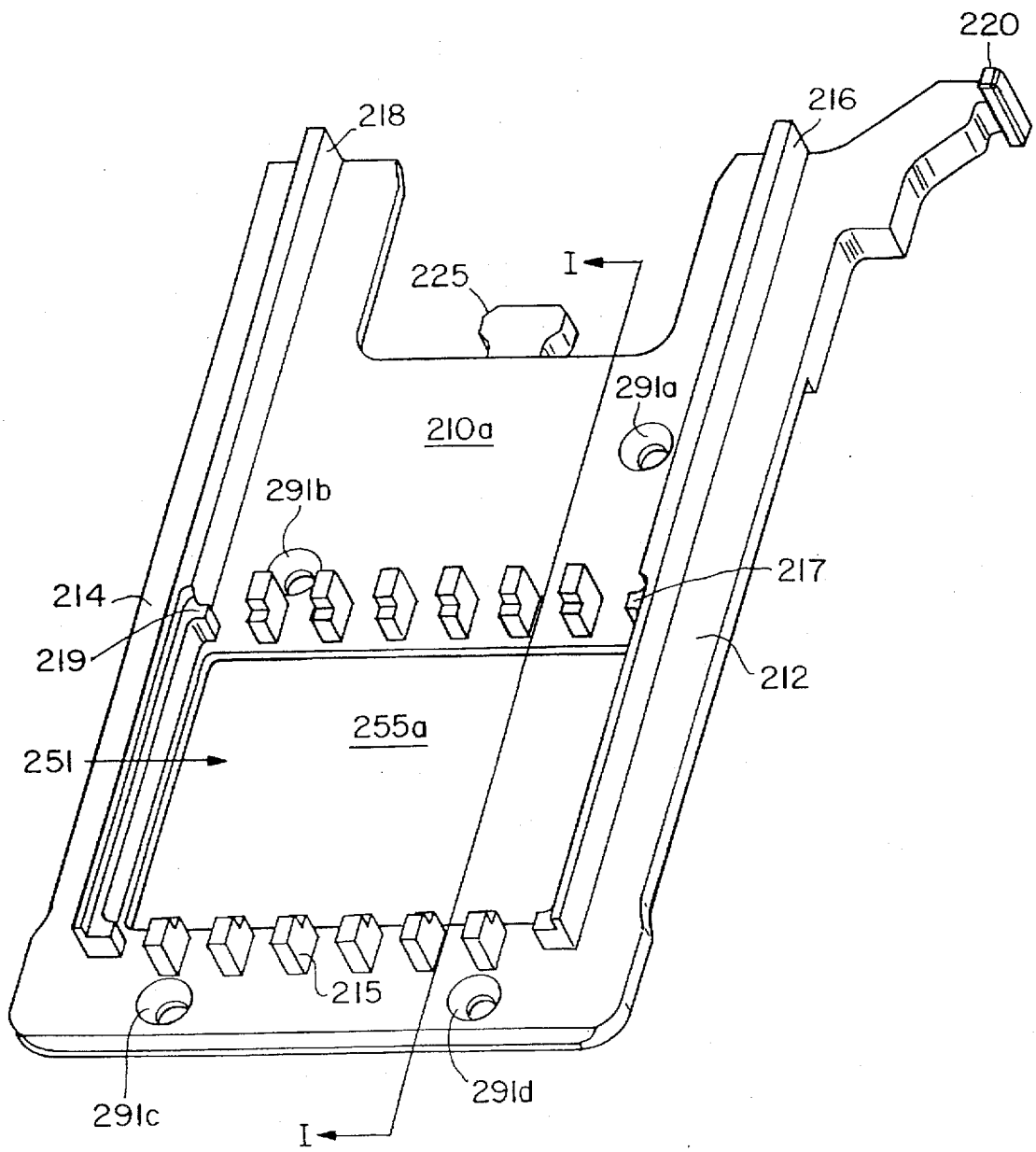
FIGS. 17A–17C are perspective views of the light valve frame 210 of FIG. 15.
Figure 17B:
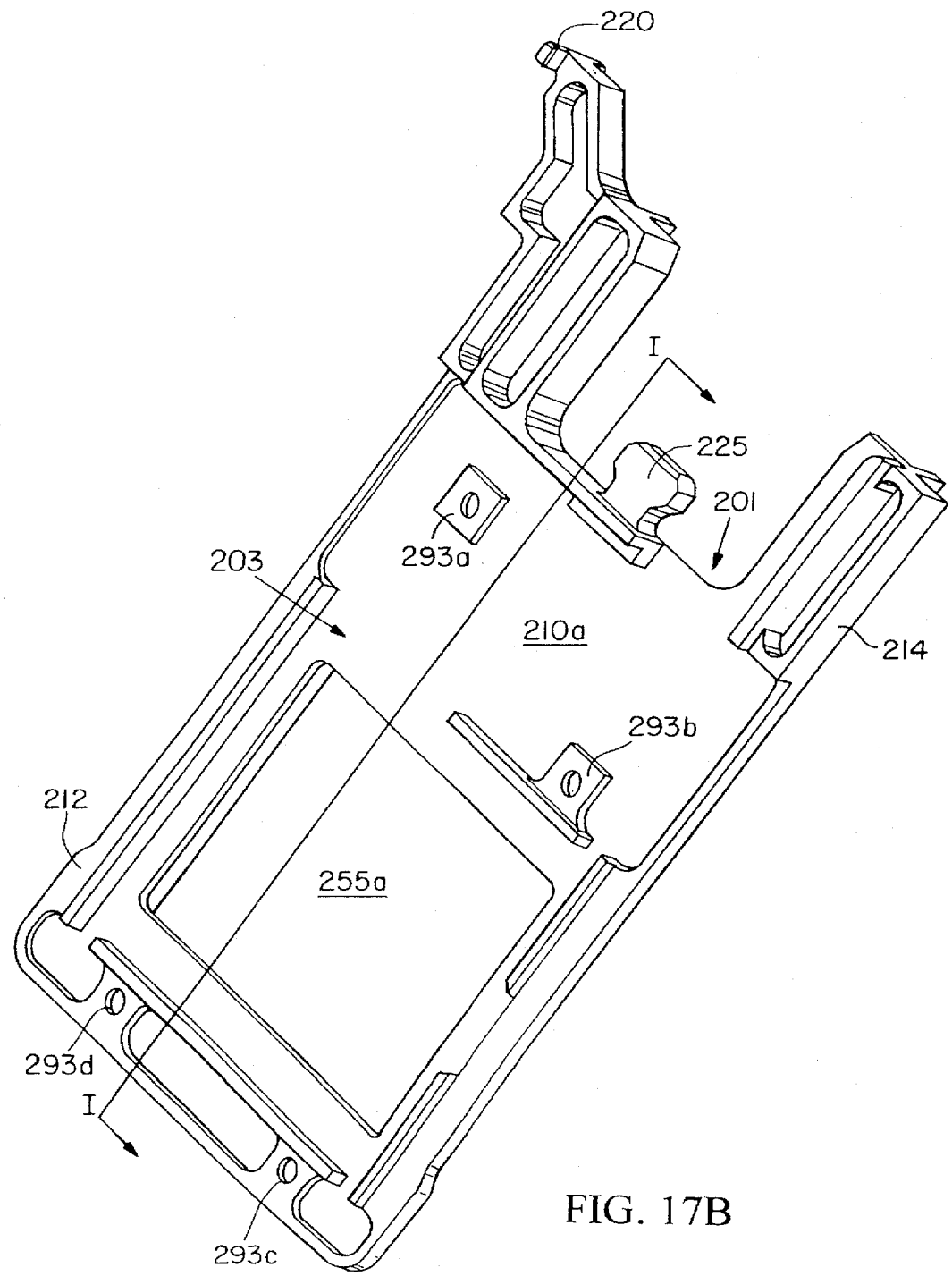
Figure 17C:
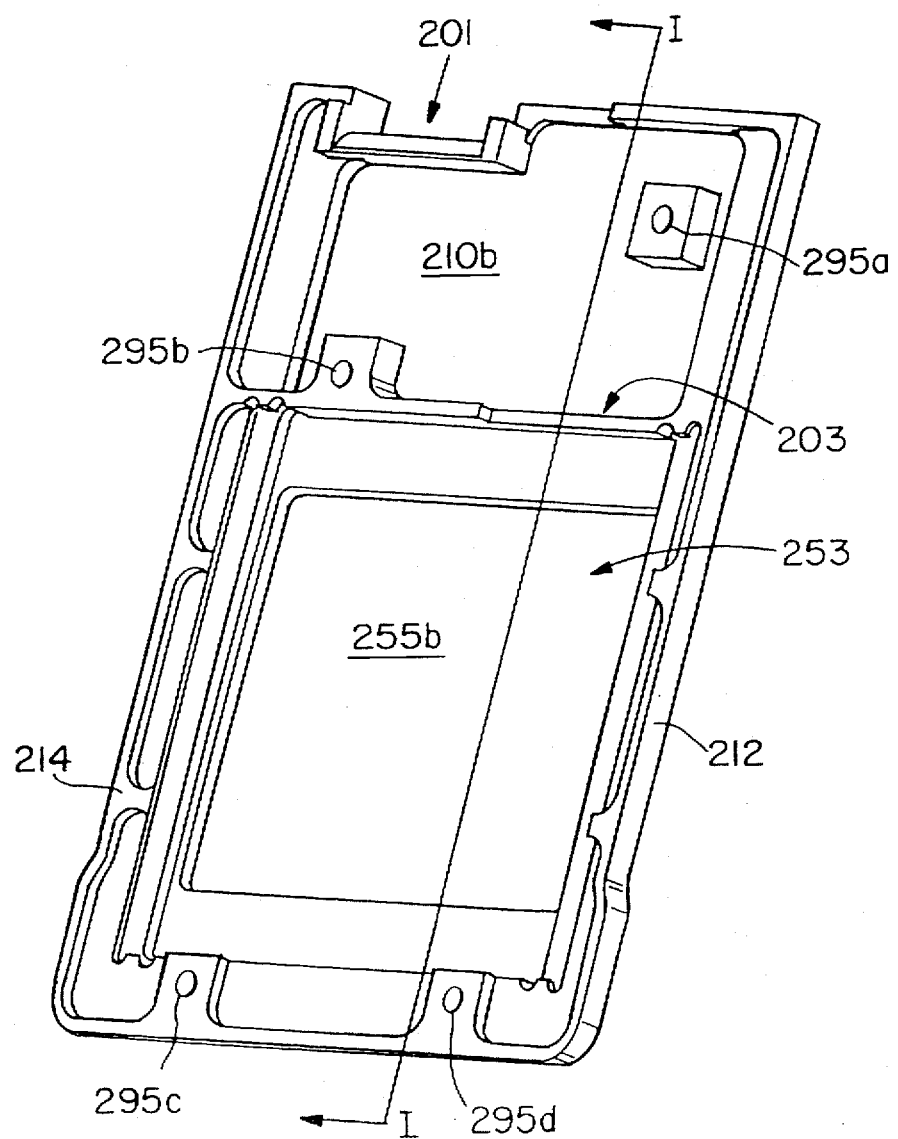

Critical features of the construction of the light valve assembly 200 are illustrated in FIGS. 17A–17C, which are perspective views of the light valve slide frame 210 of FIG. 15. The assembly frame 210 comprises two main structural features. The main structural element is the display holder 210a shown in FIGS. 17A–17B. The second main structural element is the display cover 210b, which is illustrated in FIG. 17C. As will be described in detail below, the display holder 210a and the display cover 210b are sandwiched together with a light valve display panel 250 disposed between the two elements.

FIG. 17A is a perspective view of the light-source side of the display holder 210a. Illustrated are a front rail 212 and a rear rail 214. The rails 212, 214 register to corresponding rail slots in the slide channel 143. The rails 212, 214 and the rail slots cooperate to allow and facilitate movement of the light valve assembly 200 into and out of the housing 100 while inhibiting twisting or lateral motion of the light valve assembly 200. The handle 220 is fastened to the front rail 212. Also illustrated are a front stop 216 and a rear stop 218. These stops 216, 218 work in conjunction with the rails 212, 214. A polarizer area 251 is defined between the stops 216, 218. The polarizer area 251 is registered to the display aperture 255a. The polarizer area 251 is spatially displaced from the viewing aperture 255a such that a ventilation channel is formed between the polarizer area 251 and the viewing aperture 255a. A polarizer 252 is supported by ledges 217, 218 of the stops 216, 218. Further support for the polarizer 252 can be provided by spacer support 215. There may be fewer or more spacer supports 215 than illustrated in FIG. 17A. Finally, a plurality of recessed fastening apertures 291 are shown for receiving a fastener, such as a bolt.

FIG. 17B is a perspective view of the backside of the display holder 210a of FIG. 17A. In particular, note the signal cable feed through ports 201, 203. The signal cable from the analog circuit board 134 is fed through the upper feed through port 201 and through the lower feed through port 203 to connect to a light valve display. Note that each fastening hole has a fastening support 293.

FIG. 17C is a perspective view of a display cover 210b. Again, note the upper feed through port 201 and the lower feed through port 203. The display cover 210b has formed therein a display panel area 253. The liquid crystal display panel 250 registers to the display panel area 253 such that when the display cover is fastened to the display holder 210a, the light valve display panel is fixedly aligned with the view aperture 255. Fastening nuts 295 are intrically formed in the display cover 210b.

In a preferred embodiment of the invention, both the display holder 210a and the display cover 210b are fabricated from zinc. Zinc is chosen because of suitability to casting. Other materials may be substituted instead of zinc. However, the materials of the light valve assembly frame 210 should be compatible with the materials used to form the slide channel 143 of the display housing 100. In particular, the coefficient of friction between the two materials should be low enough so that the light valve 200 can freely descend and ascend through the slide channel 143. In a preferred embodiment of the invention, the slide channel 143, as well as the housing 100, is fabricated from injection molded plastic.

Figure 17D:
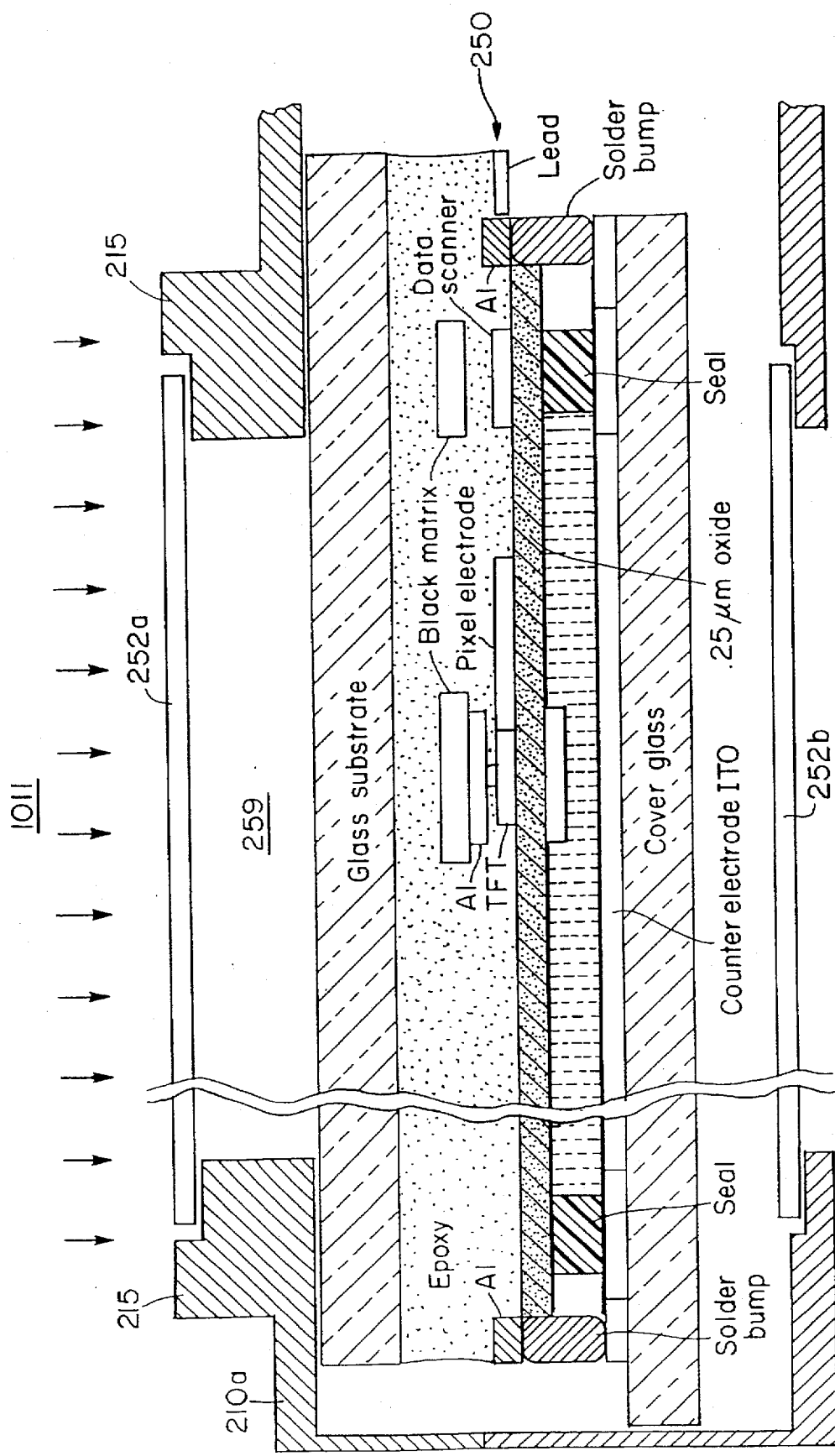
FIG. 17D is a partial schematic cross sectional view of a mounted display panel 250 taken along lines I—I of FIGS. 17A–17C.

FIG. 17D is a cross-sectional view of a mounted display panel 250 taken along section lines I—I of FIGS. 17A–17C. The display panel 250 is sandwiched between the display holder 210a and the display cover 210b. In a preferred embodiment, the display panel 250 is an active matrix liquid crystal display. It is understood that the display panel 250 could be a passive matrix liquid crystal display, or another suitable light transmissive light valve display. Note the ventilation channel 259 formed between the polarizer 252 and the active matrix 250.

Figure 18A:
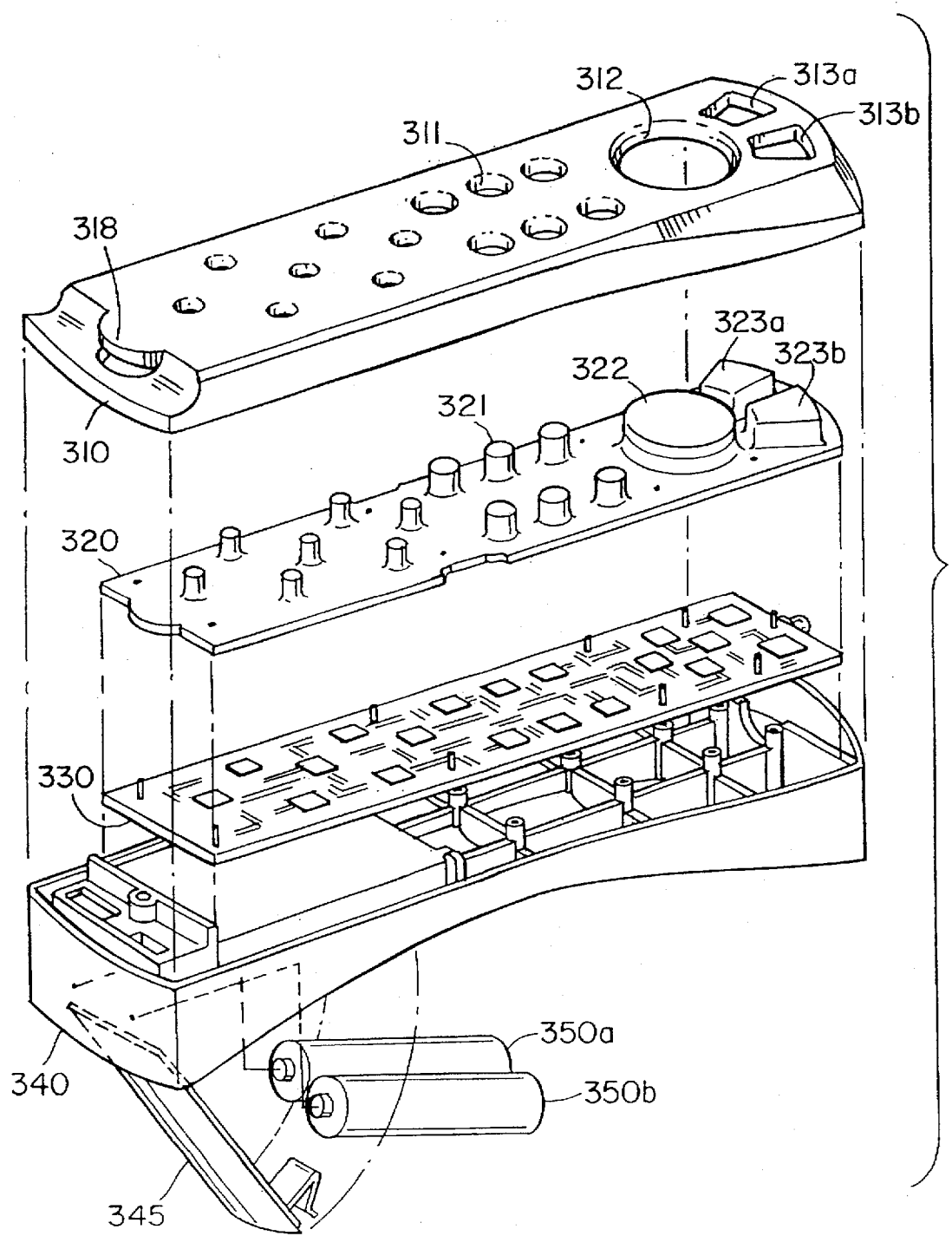
FIG. 18A is an exploded view of a remote control unit.

FIG. 18A is an exploded perspective view of a remote control device 300 for use in controlling the displayed image.

Typically, the remote control unit 300 is defined by an upper shell 310 and a lower shell 340. The upper shell 310 contains a plurality of voids 312, 314, 316 through which control buttons 322, cursor control button 324, and mouse select buttons 326 are accessed, respectively. The buttons 322, 324, 326 are preferably rubberized buttons molded onto a rubberized button insert 320. The buttons 322, 324, 326 are registered to contact pads 332, 334, 336 on a circuit board 330. In response to user inputs through the control buttons 322, 324, 326, an infrared signal is generated by LED 339. The infrared signal transmits the user's selections to housing 100.

The remote 300 is preferably powered by batteries 350 installed within a battery chamber in the lower segment 340 and secured therein by a battery door 345. The batteries preferably provide three-volts to the circuit board 330. It being understood that alternate battery configuration can be utilized instead, such as a nine-volt battery.

Figure 18B:
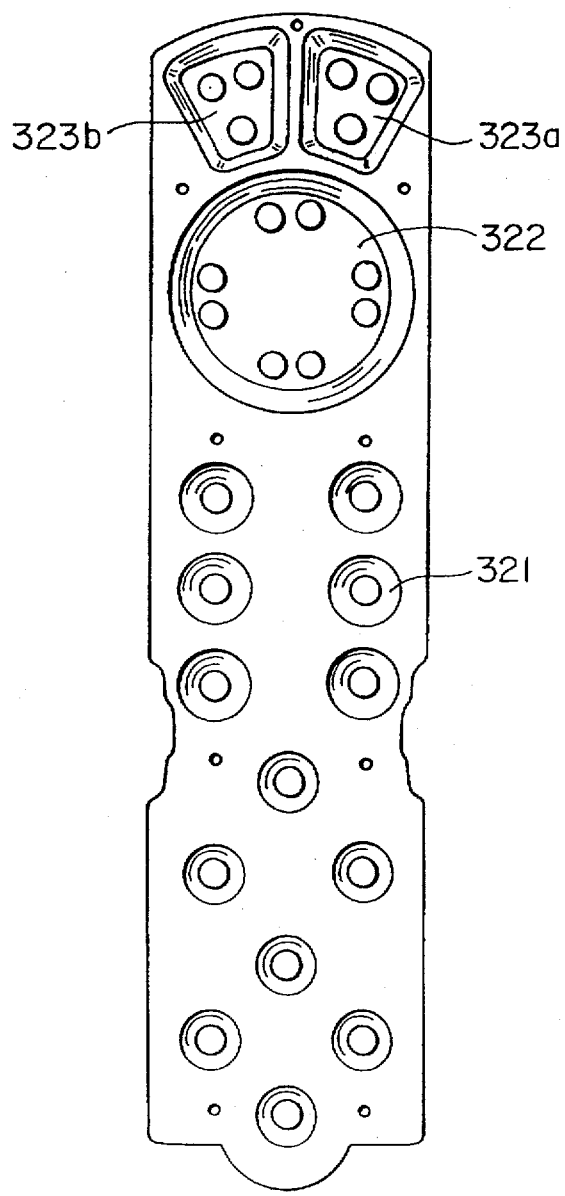
FIG. 18B is a view of the underside of the button insert 320 of FIG. 17A.

FIG. 18B is a view of the underside of the rubberized button insert 320. Each button 322, 324, 326 has at least one button contact protrusion for depressing an associated contact pad 332, 334, 336. Each control button 322 has a single button contact protrusion 333. Each mouse select button 326 has three redundant button contact protrusions 327. The mouse select buttons 326 preferably emulates standard Microsoft or Apple mouse select buttons. The functions of the select buttons 326 can be programmed to differ from standard mouse select buttons. For example, the right select button 326b can function as a drag-lock. The cursor control button 324 provides for eight-way cursor movement. There are, however, only four cursor control contact pads 334 to provide the eight-way cursor movement.

In a preferred embodiment, the cursor control button 324 has eight button contact protrusions 325. The cursor control contact protrusions 325 are paired with respective contact pads 334 such that a user selection of left, right, up or down results in a redundant depression of the respective contact pad 334. Each pair of cursor control contact protrusions are further positioned such that a diagonal user selection results in the depression of the two contact pads 334 adjacent to the diagonal direction. A processing unit interprets the depression of adjacent contact pads 334 as a diagonal cursor movement.

In another preferred embodiment, the cursor control button 324 is a plastic cap (such as a rigid disk or ring), which is registered to four directional buttons. Each directional button is registered to a respective cursor control contact pad 334. As pressure is placed on an area of the plastic cap, at least one directional button is depressed to contact a cursor control contact pad 334. If the depressed area of the plastic cap is about midway between two adjacent directional buttons, then both adjacent directional buttons are depressed. Processing similar to that discussed above, interprets this as a diagonal cursor movement.

In other preferred embodiments, cursor control is provided through a trackball or joystick dimensioned for use with the remote control 300 of course discrete cursor control keys can also be used with the remote control 300.

The remote control buttons 322 perform the same functions as the control panel buttons 181.

Figure 19:
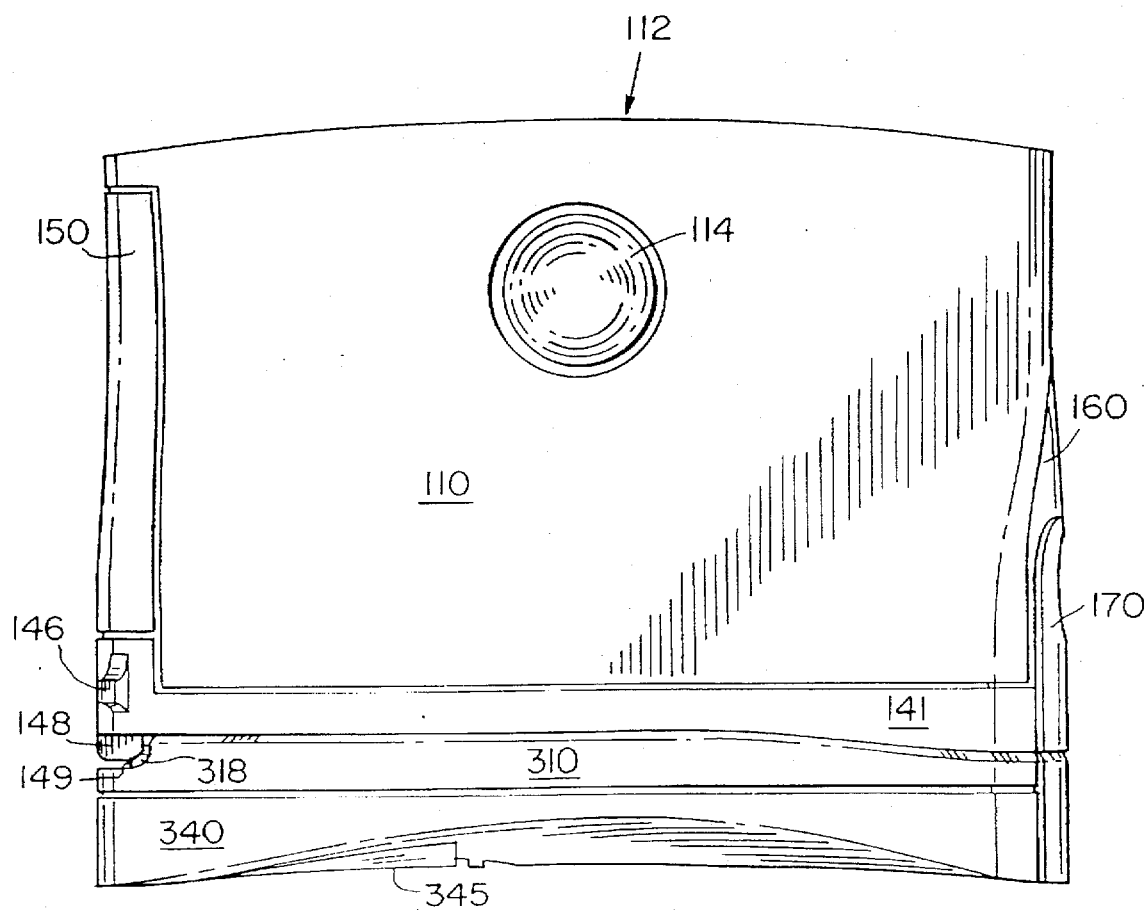
FIG. 19 illustrates a preferred embodiment of the housing with an attached remote control unit.

FIG. 19 is a right side view of the housing 100 with an attached remote control unit 300. The remote control device 300 registers to the base 141 of the housing 100, such that the remote control device 300 attaches to and stores underneath the housing 100 when the light valve slide 200 is in the upward position. In particular, a mounting tab 318 registers to the mounting slot 149 of the housing 100. The remote control device 300 is disengaged from the housing 100 by depressing the remote control release 170 on the housing 100.

EQUIVALENTS

While this invention has been particularly shown and described with reference to preferred embodiments thereof, it will be understood by those skilled in the art that various changes in form and details may be made therein without departing from the spirit and scope of the invention are defined by the appended claims.

The invention claimed is:

1. A housing for mounting a light valve display to a projector body having a light source, and a projection lens, the housing comprising:

a housing having a light valve display panel movable between a first position and a second position, the first position being within the housing and the second position being outside the housing;

a securing mechanism for securing the housing to the projector body; and a translation mechanism for actuating movement of the display panel between the first position and the second position along an optical path between the light source and projection lens.

2. The housing of claim 1 wherein the securing mechanism registers to a spindle of the projector body.

3. The housing of claim 1 wherein the securing mechanism registers to a frame tab of the projector body.

4. The housing of claim 1 wherein the securing mechanism secures to a locking mechanism of the projector body.

5. The housing of claim 1 wherein the display panel is an active matrix liquid crystal display panel.

6. The housing of claim 1 wherein the translation mechanism is manually operated by a user.

7. The housing of claim 1 wherein the translation mechanism is automatically operated in response to user commands.

8. The housing of claim 1 wherein the translation mechanism comprising a spring, the spring assisting in the urging of the display panel.

9. The housing of claim 8 wherein the spring assists in urging the display panel from the first to the second position.

10. The housing of claim 8 wherein the spring assists in urging the display panel from the second to the first position.

11. The housing of claim 1 further comprising a video interface coupled between the display panel and a remote video source.

12. The housing of claim 11 wherein the video source is a computer.

13. The housing of claim 11 wherein the video source generates a television video signal.

14. The housing of claim 11 further comprising a remote control receiver, the video source being responsive to remote control signals received by the receiver.

15. The housing of claim 14 wherein the remote control receiver comprises an infrared detector.

16. A housing for a liquid crystal display device comprising:

a housing having a liquid crystal display panel movable through an aperture in the housing between a first position and a second position, the first position being within the housing and the second position being outside the housing;

a control panel on a surface of the housing;

a video circuit within the housing that is actuated by control elements on the control panel, the video circuit being connected to a video source and the liquid crystal display; and a translation mechanism for actuating movement of the display panel between the first position and second position.

17. The housing of claim 1 wherein the display panel is an active matrix liquid crystal display panel.

18. The housing of claim 1 wherein the translation mechanism is manually operated by a user.

19. A method of projecting images on a viewing surface with a light valve display panel comprising:

securing a light valve housing having the display panel to a projector body;

positioning the display panel between a light source and a projection lens of the projector body;

directing light from the light source of the projector body through the display panel; and actuating the display panel with a control panel on the housing to selectively control light transmission through the display panel such that an image is projected on the viewing surface.

20. The method of claim 19 wherein the securing step comprises registering the housing on a spindle of the projector body.

21. The housing of claim 16 wherein the liquid crystal display comprises:

a plurality of pixel elements, each pixel element having a transistor, a pixel electrode and an adjacent color filter element;

a counterelectrode laterally spaced from the pixel electrodes by a liquid crystal material and an insulating layer; and a pair of polarizing elements spaced apart by the pixel elements, the insulating layer, the liquid crystal material and the counterelectrode.

22. The housing of claim 21 wherein the liquid crystal display further comprises an optically transmissive substrate located adjacent each of the polarizing elements that enclose the display.

23. A housing for a matrix display device comprising:

a housing;

a display device attached to the housing, the display device having a matrix display panel with a diagonal length of no more than 42 mm and movable relative to the housing between a storage position and an operating position;

an antenna and a receiver in the housing that is connected to the antenna;

a control panel on a surface of the housing; and a display control circuit within the housing that is actuated by control elements on the control panel, the control circuit being connected to the receiver and the matrix display.

24. The housing of claim 23 further comprising a cursor control on the control panel.

25. The housing of claim 24 further comprising a battery within the housing that powers the display.

26. The housing of claim 23 wherein the display housing is movable through an aperture in the housing and further comprising a translation mechanism for actuating movement of the display panel between the first position and the second position.

27. The housing of claim 26 wherein the translation mechanism is manually operated by a user.

28. The housing of claim 23 further comprising a video interface coupled between the display panel and a remote video source.

29. The housing of claim 28 wherein the video source is a computer.

30. The housing of claim 23 further comprising a remote control receiver, the video source being responsive to remote control signals received by the receiver.

31. The housing of claim 23 further comprising a cursor control device on the housing.

32. The housing of claim 23 wherein the display has a diagonal length of about 1 inch or less.

33. The housing of claim 23 wherein the display has at least 800 lines per inch.

34. The housing of claim 23 wherein the display has at least 1,200 lines per inch.

35. A housing for a matrix display device comprising:

a housing;

a display device having a matrix display panel rotatably mounted to the housing such that the matrix display rotates relative to the housing between a storage position and an operating position, the matrix display panel having at least 800 lines per inch;

a control panel on a surface of the housing;

a display control circuit within the housing that is actuated by control elements on the control panel, the display control circuit connected to the matrix display;

a receiver that receives image data from a remote source, the receiver connected to the display control circuit; and a battery carried by the housing that provides power to the display.

36. The housing of claim 35 wherein the matrix display comprises a liquid crystal display.

37. The housing of claim 35 wherein the liquid crystal display comprises:

a plurality of pixel elements, each pixel element having a transistor, a pixel electrode and an adjacent color filter element;

a counterelectrode laterally spaced from the pixel electrodes by a liquid crystal material and an insulating layer; and a pair of polarizing elements spaced apart by the pixel elements, the insulating layer, the liquid crystal material and the couterelectrode.

38. The housing of claim 35 wherein the display panel has a diagonal length of about 42 mm or less.

39. The housing of claim 35 further comprising a cursor control on the housing.

40. The housing of claim 39 wherein the cursor control comprises a joystick or trackball.

41. The housing of claim 35 wherein the display control circuit comprises a video control circuit.

42. The housing of claim 35 further comprising a lens to enlarge an image on the display.

43. The housing of claim 35 wherein the display comprises a color display.

44. The housing of claim 35 wherein the display comprises an active matrix display having a column driver circuit and a row driver circuit mounted on a common substrate.

* * * * *